(12) United States Patent
Namiki et al.

(10) Patent No.: US 6,200,724 B1
(45) Date of Patent: *Mar. 13, 2001

(54) CHEMICAL AMPLIFICATION RESIST COMPOSITIONS AND PROCESS FOR THE FORMATION OF RESIST PATTERNS

(75) Inventors: Takahisa Namiki; Ei Yano; Keiji Watanabe; Koji Nozaki; Miwa Igarashi; Yoko Kuramitsu, all of Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/715,880

(22) Filed: Sep. 19, 1996

(30) Foreign Application Priority Data

Sep. 20, 1995 (JP) .................................................. 7-242033

(51) Int. Cl.⁷ ...................................................... G03C 1/73
(52) U.S. Cl. ........................................ 430/270.1; 430/326
(58) Field of Search .................................. 430/270.1, 326

(56) References Cited

U.S. PATENT DOCUMENTS 5,342,734 * 8/1994 Lazarus et al. .................... 430/270.1
5,389,491 * 2/1995 Tani et al. .......................... 430/270.1
5,550,004 * 8/1996 Honda ................................ 430/270.1

FOREIGN PATENT DOCUMENTS 0 579 420 A2 * 1/1994 (EP) .
4-107460 * 4/1992 (JP) .
8-194313 * 7/1996 (JP) .

OTHER PUBLICATIONS

Michael J. O'Brien et al., SPIE 1988 —vol. 920 —Advances in Resist Technology and Processing V (1988) pp. 42–50.
Dennis R. McKean et al., SPIE 1988 —vol. 920 —Advances in Resist Technology and Processing V (1988) pp. 60–67.
Kwang–Duk Ahn et al., 1992, Journal of Photopolymer Science and Technology, vol. 5, No. 1, (1992) pp. 67–77.

* cited by examiner

*Primary Examiner*—Laura Weiner
(74) *Attorney, Agent, or Firm*—Armstrong, Westerman, Hattori, McLeland & Naughton, LLP

(57) ABSTRACT

A novel chemical amplification resist composition which comprises an alkali-soluble base resin, a photoacid generator and a dissolution inhibitor and in which a cyclic or acyclic structure constituting a matrix portion of the molecule of said dissolution inhibitor contains at least one lone pair-containing portion which can provide a hydrogen bond sufficient to shift and gather an alkali-soluble moiety of said base resin to and on a side of said molecule of the dissolution inhibitor compound. The resist composition can exhibit both excellent sensitivity and resolution and accordingly can be utilized in the formation of very fine resist patterns in a lithographic process. A method for forming such resist patterns is also disclosed.

16 Claims, 2 Drawing Sheets

⊚— : SIG
[INSOLUBLE IN ALKALI]

EXPOSURE ⇩

[SOLUBLE IN ALKALI]

[LONG DISTANCE CHAIN REACTION]

[SHORT DISTANCE CHAIN REACTION]

CHEMICAL AMPLIFICATION RESIST COMPOSITIONS AND PROCESS FOR THE FORMATION OF RESIST PATTERNS

BACKGROUND OF THE INVENTION

1. Field of the Invention

The present invention relates to a resist composition and, more particularly, to a novel chemical amplification resist composition for forming fine or very fine resist patterns in a lithographic process. The present invention also relates to a process for the formation of such resist patterns. The resist composition and patterning process according to the present invention can be advantageously utilized in the production of semiconductor devices such as semiconductor integrated circuits, for example, LSIs, VLSIs, ULSIs and other devices, using a lithographic process.

2. Description of the Related Art

Recently, in the production of semiconductor integrated circuits, the degree of integration thereof has been notably increased and accordingly LSIs and VLSIs have been produced on a commercial scale. The minimum line width of the circuit patterns in these devices approaches the sub-half micron or quarter micron order. In other words, in the production of these high performance devices, it is required to provide a resist material which are able to form fine or very fine resist patterns.

Further, in the production of semiconductor devices, to increase a throughput capacity thereof, it is also required to increase a sensitivity of the resist material designed for fine patterning, thereby shortening the exposure time to the patterning radiation. To satisfy these requirements, there has been recently invented a chemical amplification resist material which, as is well-known in the field, comprises a photoacid generator, i.e., photoactive acid-generating compound, in addition to a base resin. Upon exposure of the resist material to patterning radiation, the photoacid generator can release an acid which can then catalytically act on the base resin, thereby ensuring a highly increased sensitivity of the resist material.

The conventional chemical amplification resist material or composition which is considered to be relevant to the present invention comprises, in combination, an alkali-soluble base resin, a dissolution inhibitor or dissolution inhibiting agent (hereinafter, briefly referred to as "SIA") which can make the resist composition alkali-insoluble, and a photoacid generator (hereinafter, briefly referred to as "PAG"). In this resist composition, an acid is generated or released from the photoacid generator as a result of patterning exposure in the initial step of the lithographic process, and the dissolution inhibitor is decomposed by the produced acid. As a result of the decomposition, the dissolution inhibitor loses its dissolution inhibiting function, thus the resist composition can exhibit good alkali-solubility depending upon the alkali-solubility of the base resin used.

The change of the solubility in alkali of the chemical amplification resist composition will be further described with reference to FIG. 1 which illustrates an acidic catalytic reaction in the chemical amplification resist composition. As illustrated, an alkali-soluble base resin (not shown), a dissolution inhibitor (SIA) containing a dissolution inhibiting group (SIG) in a molecule thereof and a photoacid generator (PAG) are mixedly contained in the resist composition as a coating. At this stage, the resist composition is insoluble in an alkaline solution.

Then, in the exposure step, the resist composition is exposed to a patterning radiation. As a result, an acid is generated or released from the photoacid generator. The acid thus produced can act against the dissolution inhibitor, thereby cleaving the dissolution inhibiting group from a molecule of the dissolution inhibitor. Since the dissolution inhibitor loses its inherent function of maintaining the alkali-insolubility of the resist composition, the exposed resist composition can change its solubility in an alkaline solution from insoluble to soluble. Accordingly, when it is developed with an aqueous alkaline solution, the exposed resist composition can provide positive resist patterns. Alternatively, if it is developed with an organic solvent having a low polarity, the exposed resist composition can provide negative resist patterns.

In the chemical amplification resist composition containing the above-mentioned components, it becomes possible to increase a sensitivity of the resist composition, because the acid released from the photoacid generator can act as a catalyst against other components in the composition, and can result in many reactions therebetween.

In addition to the improvement of the sensitivity, it is also necessary to improve the resolution of the chemical amplification resist composition, and such an improvement of the resolution largely relies upon the properties of the dissolution inhibitor which is also contained in the resist composition. Especially, in order to increase a contrast in the dissolution speed and thus attain an increased resolution in the resist composition, the dissolution inhibitor used should completely inhibit dissolution of the resist composition in an alkali prior to patterning exposure, however, after completion of the exposure, the dissolution inhibitor has to be decomposed so that the dissolution of the resist composition in the alkali can be accelerated in the absence of said dissolution inhibitor.

At present, no dissolution inhibitor capable of exhibiting both a high dissolution inhibiting function (before exposure) and a high dissolution accelerating function (after exposure), thereby ensuring a sufficient exposure contrast, is known. The well-known dissolution inhibitors have a drawback in that, before exposure, they cannot exhibit a sufficiently high capability of inhibiting dissolution of the resist composition in the alkali. For example, O'Brien et al. SPIE, Vol. 920, *Advances in Resist Technology and Processing V* (1988), pp. 42–50, teaches use of a dissolution inhibitor such as naphthalene-2-carboxylate, t-butoxycarbonyloxy naphthalene and others, however, these dissolution inhibitors cannot provide a good contrast of the dissolution speed before and after exposure because of its poor dissolution inhibiting action (before exposure). As a result, the resist material containing the described dissolution inhibitors can provide only insufficient resolution in the resulting resist patterns.

There are other approaches to improve the dissolution inhibitors used in the resist composition. For example, McKean et al., SPIE, Vol. 920, *Advances in Resist Technology and Processing V* (1988), pp. 60–66, teaches introduction of bisphenol or others in a matrix portion of the dissolution inhibitor compound. Further, there has been taught the introduction of a new dissolution inhibiting group into a molecule of the dissolution inhibitor, i.e., the use of the dissolution inhibiting group capable of being decomposed with an acid, thus accelerating dissolution of the resist composition in an alkali, such as tetrahydrofuran and others. However, these improved dissolution inhibitors are still insufficient to provide a satisfactory contrast in dissolution speed and, accordingly, a satisfactory resolution, namely, they suffer from the same problems as in the above-discussed well-known dissolution inhibitors.

In addition, it has been noted in the chemical amplification resist composition that its resolution can vary widely depending upon a diffusion distance of acid generated in the resist coating and a reaction distance of the caused chain reaction, i.e., the distance from an initial point at which the acidic catalytic reaction was started to an end point at which the reaction ceases. Immediately after exposure, no diffusion of acid is observed in the resist composition, however, the generated acid can gradually diffuse in the resist composition depending upon factors such as lapse of time and postexposure baking (hereinafter, briefly referred to as "PEB") for proceeding the acidic catalytic reaction, namely, the diffusion distance of the acid can gradually increase after exposure. Similarly, the reaction distance of the chain reaction can increase with the progress of the acidic catalytic reaction. The increased distance in the acid diffusion and chain reaction induces undesirable reduction in the resolution.

In order to avoid the reduction of the resolution due to acid diffusion and other factors, there has been suggested a method in which the unexposed resist is baked at an increased prebaking temperature to make a dense resist coating which is effective to inhibit diffusion of the acid therein and thus increase a solubility thereof. This method is enough to control the diffusion of acid to some extent, however, it is insufficient to shorten the distance of the chain reaction. Accordingly, the resulting effects are not satisfactory.

Another approach is to lower the PEB temperature, thereby shortening the distance of the chain reaction. However, due to the resulting reduction of the amount or extent of the chain reaction, this method can cause a remarkable reduction of the sensitivity of the resist. Namely, it can diminish the merits obtained by using the chemical amplification resists. In other words, for the improvement of the resolution of the chemical amplification resists, it is required that the distance of the chain reaction is shortened without reducing the amount of the reaction.

In addition to the above problem concerning the distance in the acid diffusion and chain reaction, there is another problem concerning the solubility of the dissolution inhibitor used in a resist solvent. If the dissolution inhibitor has a low solubility in the resist solvent, it is difficult to add a necessary amount of the dissolution inhibitor to the resist. An excess amount of the dissolution inhibitor can precipitate from the solvent after preparation of the resist, thus causing possible problems. The usable resist solvents include many organic solvents such as ethyl lactate, butyl acetate, propylene glycol monoethylether acetate and others, however, recently, there is a tendency that the selection of the suitable resist solvent from the usable solvents becomes difficult in view of environmental protection and the safety of users. In other words, the problem of the solubility of the dissolution inhibitor in the resist solvent has to be solved while using a limited number of the resist solvents.

The last remaining problem is related to the above-discussed problem concerning the controlled dissolution speed. In the chemical amplification resist composition, if it is intended to increase its functions and properties, the key point is whether the dissolution inhibitor used in the resist composition can completely render the composition, as a whole, alkali-insoluble. It is the fact that any dissolution inhibitor compound capable of freely controlling an alkali-solubility of the resist composition and having excellent functions and properties has not yet been suggested in the field of the chemical amplification resist composition. It should be noted that the prior art problems cannot be solved, even if the compound or molecule having a low polarity is used as the dissolution inhibitor, because the dissolution inhibitor used must have a function of attracting polar groups of the alkali-soluble base resin such as novolak resin and polyvinyl phenol resin, for example, acidic hydroxyl group, through a hydrogen bond thereof towards the dissolution inhibitor itself. The inductive production of a hydrogen bond will result if the molecule of the dissolution inhibitor used contains atoms including lone pair of electrons, however, contrary to this, there arises a problem that the substituent group having a high polarity can diminish the expected dissolution inhibiting function.

SUMMARY OF THE INVENTION

One object of the present invention is to solve all the problems in the prior art chemical amplification resists, and thus provide a novel chemical amplification resist composition having both excellent sensitivity and resolution which can be advantageously utilized in the formation of fine or very fine resist patterns in a lithographic process.

Particularly, the present invention is directed to provide a chemical amplification resist composition ensuring a satisfactory contrast of the dissolution speed, thereby improving high resolution.

Further, the present invention is directed to provide a chemical amplification resist composition ensuring shortening of the reaction distance of the chain reaction, caused by diffusion of an acid, without reduction of the amount of said chain reaction, thereby improving resolution and inducing other related effects.

Furthermore, the present invention is directed to providing a chemical amplification resist composition which contains a dissolution inhibitor having an improved solubility in a resist solvent, which solubility is necessary to obtain a satisfactory dissolution inhibiting function or capability.

In addition, the present invention is directed to provide a chemical amplification resist composition which contains a dissolution inhibitor capable of producing or inducing a hydrogen bond in its molecule, thereby ensuring a satisfactory dissolution inhibiting function or capability without an increase in the polarity of the molecule itself.

Another object of the present invention is to provide a process for the preparation of a chemical amplification resist composition.

Another object of the present invention is to provide a process for the formation of fine or very fine resist patterns with excellent sensitivity and dissolution.

These and other objects of the present invention will be understood from the descriptions as set forth below with regard to the preferred embodiments of the present invention.

In one aspect thereof, the present invention provides a chemical amplification resist composition for forming resist patterns which comprises a combination of an alkali-soluble base resin, a photoacid generator and a dissolution inhibitor, in which said dissolution inhibitor is a compound of the following formula (I):

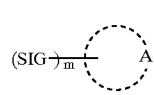

(I)

wherein

A represents atoms necessary to complete a cyclic or acyclic structure constituting a matrix core portion of the molecule of said dissolution inhibitor, SIG may be the same or different and each represents a dissolution inhibiting group capable of being released from said cyclic or acyclic structure A, to which said dissolution inhibiting group is directly or indirectly bonded, upon the action of an acid which is released from said photoacid generator, and m represents the number of said dissolution inhibiting group SIG bonded to said structure A and is an integer of 1 or more, and said structure A of said compound of the dissolution inhibitor contains at least one lone pair (or lone pair of electrons)-containing portion which can provide a hydrogen bond sufficient to shift and gather an alkali-soluble moiety of said base resin toward a side of said molecule of the dissolution inhibitor compound, and said lone pair-containing portion is a member selected from the group consisting of:

(1) a group containing an oxygen atom with the double bond (hereinafter, referred to as "the double bonded oxygen atom-containing group") of the following formula:

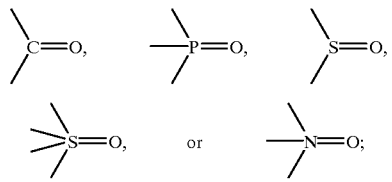

(2) an alkoxy or alkoxycarbonyl group of the following formula:

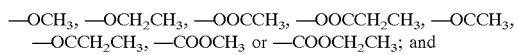

(3) a halogen atom including chlorine, fluorine, iodine and bromine.

In this chemical amplification resist composition, it is preferred that at least two double bonded oxygen-containing groups (1), at least three alkoxy or alkoxycarbonyl groups (2) and/or at least three halogen atoms (3) are included in the same molecule of said dissolution inhibitor compound.

Further, in this chemical amplification resist composition, it is preferred that the structure A of the dissolution inhibitor compound is a cyclic group having no conjugated double bond.

Furthermore, it is preferred that the dissolution inhibiting group SIG of the dissolution inhibitor compound is a member selected from the group consisting of:

SIG-1
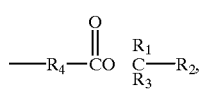

SIG-2
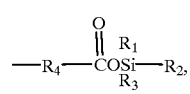

SIG-3
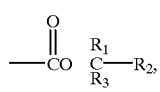

-continued

SIG-4
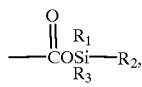

SIG-5
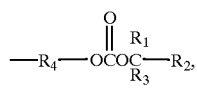

SIG-6
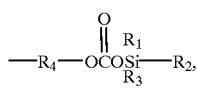

SIG-7
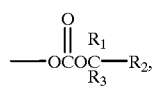

SIG-8
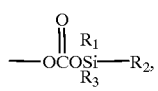

SIG-9
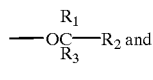

SIG-10
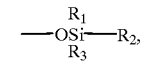

wherein $R_1$, $R_2$ and $R_3$ may be the same or different and each represents a hydrogen or a substituted or unsubstituted substituent group such as, preferably, methyl, ethyl, phenyl, cyclohexyl or cyclopentyl and $R_4$ represents a substituted or unsubstituted alkylene group or, preferably, a methylene or ethylene group.

In the chemical amplification resist composition according to the present invention, the base resin used as a principal component thereof is preferably a member selected from the group consisting of phenol-novolak resin, cresol-novolak resin, phenol-cresol-novolak resin, copolymer of polyhydroxystyrene, polycarboxystyrene and/or hydroxystyrene with a monomer containing a carbon—carbon double bond, copolymer of carboxystyrene with a monomer containing a carbon—carbon double bond, copolymer of hydroxystyrene with carboxystyrene, silphenylenesiloxane polymer containing an acetylated benzene ring, siloxane polymer containing an acetylated benzene ring, silphenylenesiolxane polymer containing a silanol group, siloxane polymer containing a silanol group, silphenylenesiloxane polymer containing a carboxyl or acidic hydroxyl group, and siloxane polymer containing a carboxyl or acidic hydroxyl group.

In another aspect thereof, the present invention provides a chemical amplification resist composition for forming resist patterns which comprises a combination of an alkali-soluble base resin, a photoacid generator and a dissolution inhibitor, in which said dissolution inhibitor is a compound of the following formula (II):

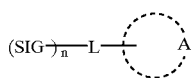

(II)

wherein
A represents atoms necessary to complete a cyclic or acyclic structure constituting a matrix core portion of the molecule of said dissolution inhibitor, SIG may be the same or different, each represents a dissolution inhibiting group capable of being released from said cyclic or acyclic structure A, to which said dissolution inhibiting group is indirectly bonded through a linkage group L, upon the action of an acid, which is released from said photoacid generator, and is concentratedly distributed in the molecule of said dissolution inhibitor, L is a linkage group connecting the SIG group to said structure A, and may be independently included for each SIG group or may be commonly included for all or some (two or more) SIG groups with the proviso that the number of atoms contained between the adjacent SIG groups is not more than 4, and n represents the number of said SIG group bonded to said structure A and is an integer of 3 or more.

In this chemical amplification resist composition, it is preferred that the structure A of the dissolution inhibitor compound contains at least one atom selected from the group consisting of an oxygen atom, a sulfur atom, a halogen atom, a nitrogen atom and a phosphorus atom, and that the structure A of the dissolution inhibitor compound contains at least one, double bonded oxygen atom-containing group of the following formula:

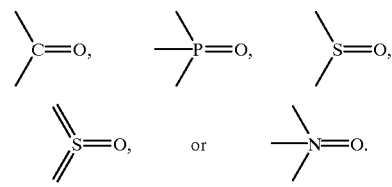

Further, it is preferred in this chemical amplification resist composition that the structure A of the dissolution inhibitor compound is an aromatic group, a saturated cyclic group or a chain group.

Preferably, the saturated cyclic group constituting said structure A of the dissolution inhibitor compound is a member selected from the group consisting of a cyclooctyl ring, a cycloheptyl ring, a cyclohexyl ring, a cyclopentyl ring, a cyclobutyl ring, a adamantyl ring, a tetrahydrofuranyl ring, a tetrahydrothiophenyl ring, a dioxanyl ring, a cyclooctanonyl ring, a cycloheptanonyl ring, a cyclohexanonyl ring, a cyclopentanonyl ring, a cyclobutanonyl ring, a butylolactone ring, a piperidinyl ring and a piperadinyl ring.

Furthermore, in this chemical amplification resist composition, the dissolution inhibiting group SIG of the dissolution inhibitor compound may preferably include the SIG groups similar to those described above with regard to the resist composition according to the first aspect of the present invention.

Also, the alkali-soluble base resin in this chemical amplification resist composition may preferably include the resins similar to those described above with regard to the first aspect of the present invention.

In another aspect thereof, the present invention provides a chemical amplification resist composition for forming resist patterns which comprises a combination of an alkali-soluble base resin, a photoacid generator and a dissolution inhibitor, in which said dissolution inhibitor is a compound of the following formula (III):

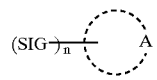

(III)

wherein
A represents atoms necessary to complete a cyclic or acyclic structure constituting a matrix core portion of the molecule of said dissolution inhibitor, SIG may be the same or different and each represents a dissolution inhibiting group capable of being released from said cyclic or acyclic structure A, to which said dissolution inhibiting group is directly or indirectly bonded, upon the action of an acid, which is released from said photoacid generator, said SIG group being a member selected from the group consisting of:

SIG-11

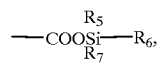

SIG-12

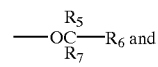

SIG-13

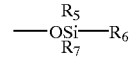

SIG-14 wherein
$R_5$, $R_6$ and $R_7$ may be the same or different and each represents hydrogen or any substituent group with the proviso that at least one of said substituent groups is a halogenated alkyl group of 3 or less carbon atoms, and n represents the number of said dissolution inhibiting groups SIG bonded to said structure A and is an integer of 3 or more, and said dissolution inhibitor compound has a molecular weight of 300 to 1500.

In this chemical amplification resist composition, the structure A of the dissolution inhibitor compound is preferably benzophenone, adamantane or cyclohexane.

Further, in this chemical amplification resist compositions other components contained therein may be those conventionally used in the chemical amplification resist composition. For example, the alkali-soluble base resin may preferably include the resins similar to those described above with regard to the first and second aspects of the present invention. The photoacid generator is preferably a member selected from the group consisting of a sulfonium salt compound, an iodonium salt compound, a benzyltosylate compound and an organic halogen-containing compound.

In another aspect thereof, the present invention provides a process for the preparation of a chemical amplification resist composition which comprises the step of preparing the above-described dissolution inhibitor compound.

In still another aspect thereof, the present invention provides a process for the formation of resist patterns which comprises the steps of:

coating the above-mentioned chemical amplification resist composition of the present invention on a substrate to be fabricated, thereby forming a resist coating thereon;

selectively exposing said resist coating to a patterning radiation capable of causing a decomposition of said dissolution inhibitor, preferably ionizing radiation; and developing the exposed resist coating with an aqueous alkaline solution.

In the chemical amplification resist compositions according to the present invention, the base resin, photoacid generator, dissolution inhibitor and others which constitute the resist composition as well as the resist solvent and others used in the resist solution, as will be described hereinafter, may be used alone or may be used as a mixture of two or more components. Further, the compounds used as a constitutional component in the present resist composition may be unsubstituted or, if desired, may be substituted with any desirable substituent, unless otherwise specified.

In brief, according to the present invention, since the dissolution inhibitor to be used in the chemical amplification resist composition was improved with regard to its contrast of the dissolution speed and also solubility in a resist solvent, it becomes possible to provide novel resist materials for forming fine or very fine resist patterns with excellent properties in both the sensitivity and resolution. In addition, when using the novel resist materials of the present invention, it becomes possible to form fine or very fine resist patterns which are useful in the production of semiconductor devices and others.

DESCRIPTION OF THE PREFERRED EMBODIMENTS

Figure 1:
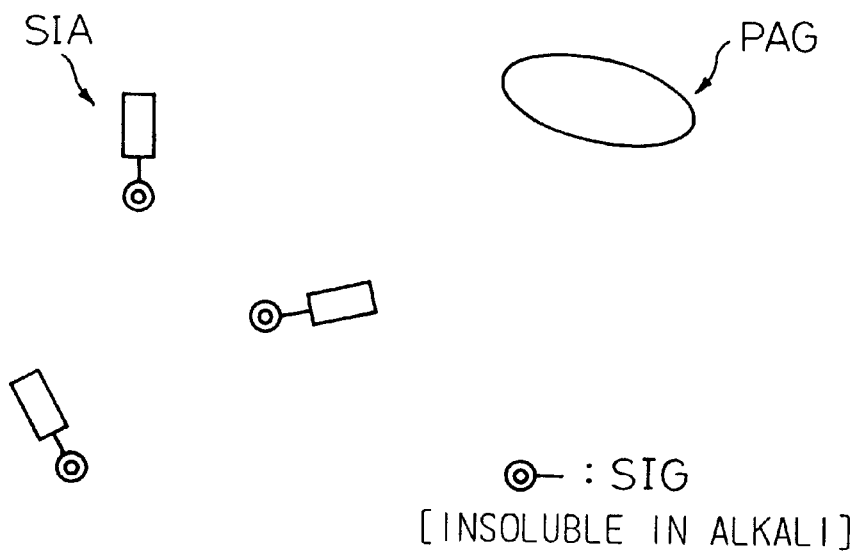
FIG. 1 is a schematic view showing the acidic catalytic reaction observed upon exposure to patterning radiation in the chemical amplification resist composition.
Figure 1:
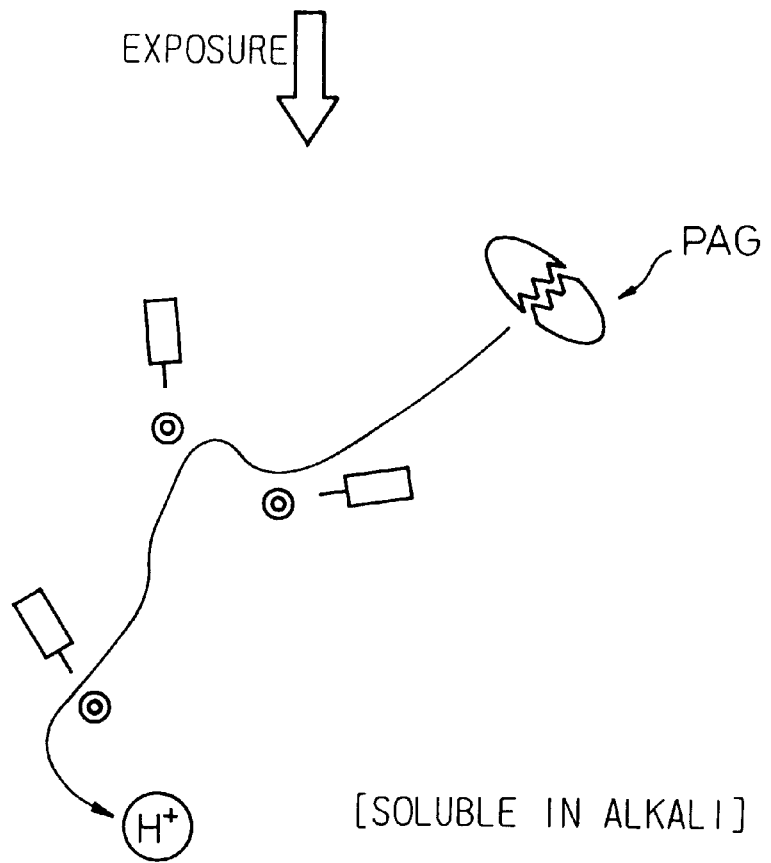

The present invention will be further described with reference to the preferred embodiments thereof. Note, however, that the present invention should not be restricted to these embodiments.

As a result of a thorough analysis of the unavoidable problems in the prior art chemical amplification resists, the inventors have found that an insufficient dissolution inhibiting function of the resists is present because an alkali-soluble moiety such as hydroxyl and carboxyl groups of the base resin is not gathered or concentratedly distributed in a side of the molecule of the dissolution inhibitor used in combination with the base resin. The inventors have also found that if a hydrogen bond can shift and gather the alkali-soluble moiety of the base resin towards the molecular side of the dissolution inhibitor, the resists, as a whole, will show reductions in their dissolution speeds or solubilities in an alkali, thereby ensuring satisfactory contrast in the dissolution speed.

The dissolution inhibitors which are thought to be appropriate for the above object include naphthalene carboxylic acid t-butyl ester, t-butoxy carbonyloxy naphthalene and the like. However, these dissolution inhibitor compounds do not exhibit good dissolution inhibition, because they do not readily generate the desired hydrogen bond. The carboxylic ester and t-butoxy carbonyloxy groups have the C=O bond which tends to form a hydrogen atom, however, as a result of study, the inventors have found that the generation or induction of a hydrogen bond by said C=O bond-containing group cannot be substantially expected, if any large substituent group such as t-butyl group is positioned near said C=O bond-containing group. Surprisingly, the inventors have now found that the expected effects concerning the hydrogen bond can be accomplished in the used dissolution inhibitor, if the generation of the hydrogen bond and the dissolution inhibition are separately caused in the same molecule of the dissolution inhibitor, namely, the function of producing a hydrogen bond is conferred onto another moiety or portion of the dissolution inhibitor compound, which is discrete from a moiety or portion containing the dissolution inhibiting group of the same compound.

More particularly, according to the present invention, the expected effects can be obtained in the dissolution inhibitor compound represented by the above-mentioned formula (I), if at least one lone pair capable of producing or inducing a hydrogen atom (hereinafter, referred to as "lone pair-containing portion") is contained in a portion of the inhibitor compound other than the dissolution inhibiting group SIG, i.e., in the cyclic or acyclic structure A constituting a matrix portion of the inhibitor compound. A suitable lone pair-containing portion includes, for example, (1) the double bonded oxygen atom-containing groups, (2) alkoxy and alkoxycarbonyl groups such as methoxy and ethoxy groups and (3) halogen atoms such as chlorine, fluorine, iodine and bromine, and typical examples of this portion have been already mentioned with reference to the chemical formulae thereof.

When the alkoxy or alkoxycarbonyl group or the halogen atom should be introduced as said lone pair-containing portion to the dissolution inhibitor compound, it is contemplated that at least three of such groups or atoms are contained in the same molecule of the dissolution inhibitor compound. Further, when the double bonded oxygen-containing group, i.e., the group containing an oxygen atom with the double bond, is introduced into a matrix portion of the dissolution inhibitor compound, it is expected that electrons are attracted towards the oxygen atom side of the introduced group in view of its elecronegativity, and thus the effects of inducing the hydrogen bond are increased. Note that, in order to induce a satisfactory amount of the hydrogen bond, at least two double bonded oxygen-containing groups should be contained within the same molecule of the dissolution inhibitor compound.

In the practice of the present invention, the matrix structure A of the dissolution inhibitor compound represented by the above formula (I) is not restricted, and accordingly it may be either cyclic or acyclic. For the purpose of using the described chemical amplification resist composition as a photoresist, it is preferred that said matrix structure A is a cyclic structure having no conjugated double bond, because said structure can provide a high resistance to etching and less absorption of ultraviolet radiation. Typical examples of suitable cyclic structure A includes cyclooctyl ring (A-1), cycloheptyl ring (A-2), cyclohexyl ring (A-3), cyclopentyl ring (A-4), cyclobutyl ring (A-5), adamantyl ring (A-6), tetrahydrofuranyl ring (A-7), tetrahydrothiophenyl ring (A-8), dioxanyl ring (A-9), cyclooctanonyl ring (A-10), cycloheptanonyl ring (A-11), cyclohexanonyl ring (A-12), cyclopentanonyl ring (A-13), cyclobutanonyl ring (A-14), butylolactone ring (A-15), piperidinyl ring (A-16), piperadinyl ring (A-17) and the like, and these rings are represented by the following formulae:

A-1

A-2

A-3

A-4

A-5

A-6

A-7

A-8

A-9

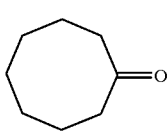

A-10

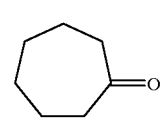

A-11

-continued

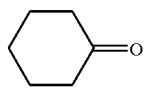

A-12

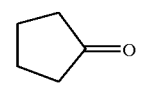

A-13

A-14

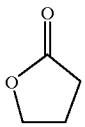

A-15

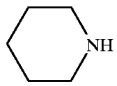

A-16

A-17

Further, the dissolution inhibiting group SIG to be introduced as a substituent group into the molecule of the dissolution inhibitor compound is also not restricted in the practice of the present invention. Accordingly, any suitable SIG group can be freely selected from many dissolution inhibiting groups conventionally used in the field of resist chemistry after consideration of factors such as the desired dissolution inhibiting function. Typical examples of suitable SIG groups include the above-listed groups SIG-1 to SIG-10. As above mentioned, only one SIG group may be included in the dissolution inhibitor compound or, if desired, two or more SIG groups may be included in the inhibitor compound. In the latter case, any combination of the SIG groups can be adopted.

Accordingly, typical examples of the dissolution inhibitor SIA which can be advantageously used in the practice of the present invention can be represented by the following formulae:

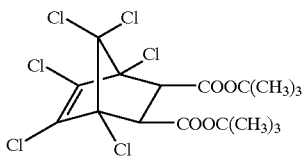

SIA-1

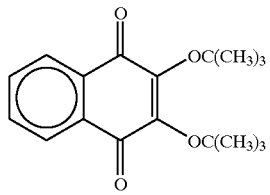

SIA-2

-continued

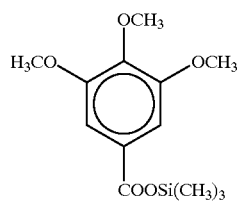
SIA-3

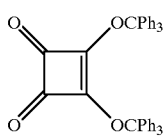
SIA-4

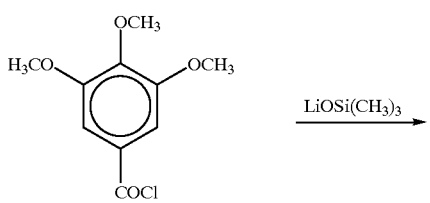
SIA-5

The above-described dissolution inhibitors SIA-1 to SIA-4 each can be produced from the following starting material in accordance with the conventional production process.

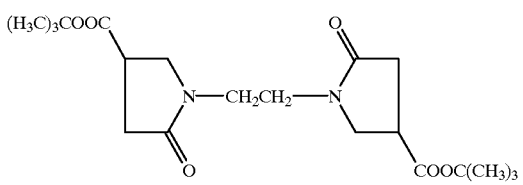

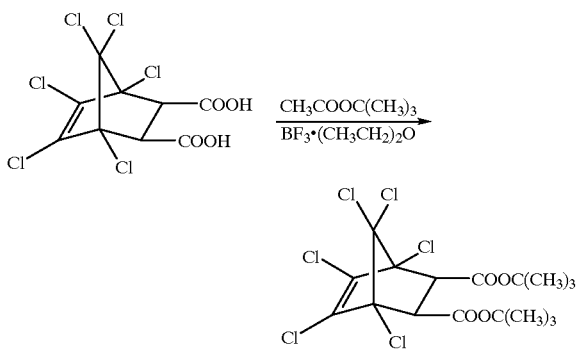

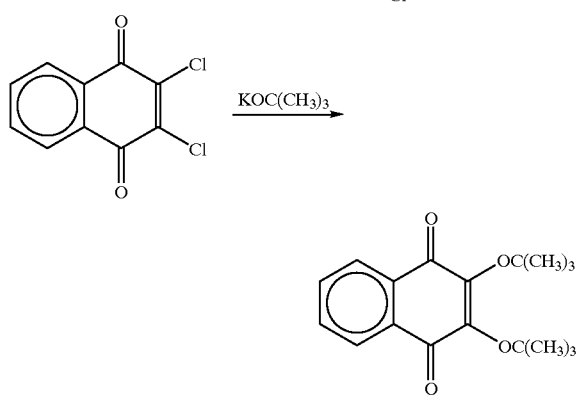

-continued

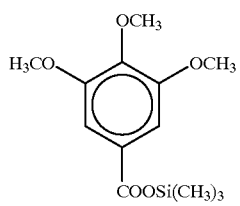

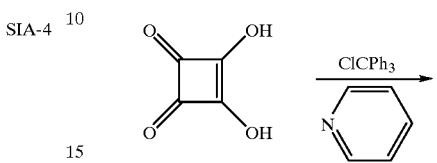

Furthermore, the alkali-soluble base resin used in combination with said dissolution inhibitor and other components in the resist composition is also not restricted in the practice of the present invention. Accordingly, any suitable base resin may be used alone or in combination by freely selecting a suitable one from any conventional base resins well-known in the field of resist chemistry. The typical examples of suitable base resins, although they should not be restricted to the below-mentioned, include phenol-novolak resin, cresol-novolak resin, phenol-cresol-novolak resin, copolymer of polyhydroxystyrene, polycarboxystyrene and/ or hydroxystyrene with a monomer containing a carbon—carbon double bond, copolymer of carboxystyrene with a monomer containing a carbon—carbon double bond, copolymer of hydroxystyrene with carboxystyrene, silphenylenesiloxane polymer containing an acetylated benzene ring, siloxane polymer containing an acetylated benzene ring, silphenylenesiloxane polymer containing a silanol group, siloxane polymer containing a silanol group, silphenylenesiloxane polymer containing a carboxyl or acidic hydroxyl group, siloxane polymer containing a carboxyl or acidic hydroxyl group, and the like. Some of these suitable base resins are represented by the following formulae:

m/p-cresol-novolak resin:

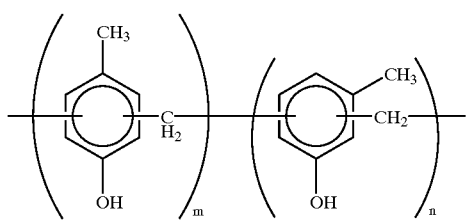

phenol-novolak resin:

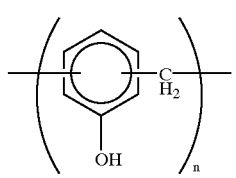

polyhydroxystyrene:

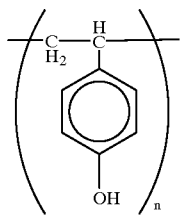

linear type acetylated polysiloxane:

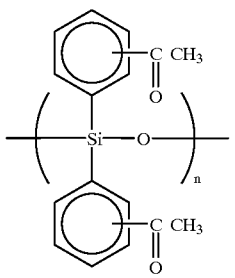

ladder type acetylated polysilphenylenesiloxane:

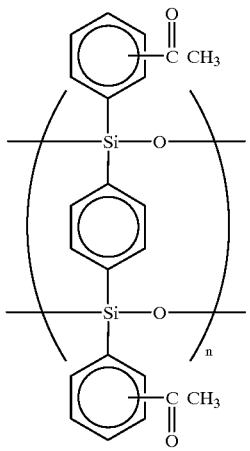

Furthermore, the photoacid generator PAG used in combination with the dissolution inhibitor, base resin and others in the resist composition is also not restricted in the practice of the present invention. Any suitable photoacid generator may be used alone or in combination by freely selecting a suitable one from the conventional photoacid generators well-known in the field of resist chemistry. The photoacid generator PAG used in the resist composition can generate a protonic acid upon exposure of the resist composition as a coating to patterning radiation such as ultraviolet (UV) radiation, far UV radiation, vacuum UV radiation, electron beam, X-ray, laser light and the like. Suitable photoacid generators include, for example, onium salts, sulfonic acid esters, halogenated hydrocarbons and the like. Typical examples of each of these suitable photoacid generators include the following compounds:

onium salts

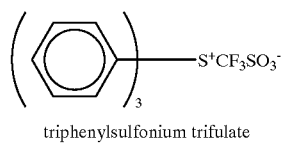

triphenylsulfonium trifulate

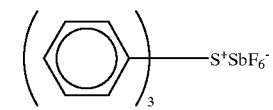

triphenylsulfoniumhexafluoroantimonate

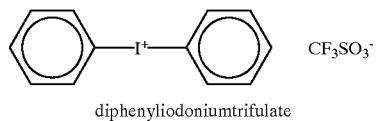

diphenyliodoniumtrifulate

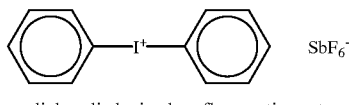

diphenyliodoniumhexafluoroantimonate

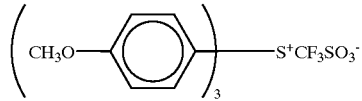

tris(methoxyphenyl)sulfoniumtrifulate

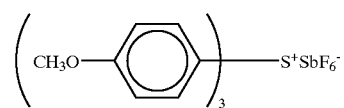

tris(methoxyphenyl)sulfoniumhexafluoroantimonate

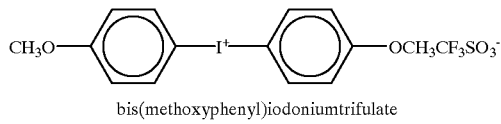

bis(methoxyphenyl)iodoniumtrifulate

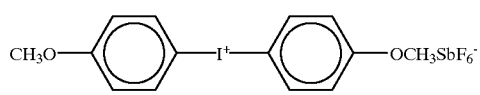

bis(methoxyphenyl)iodoniumhexafluoroantimonate sulfonic acid esters

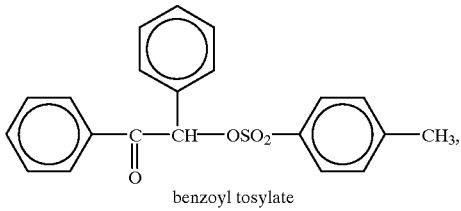

benzoyl tosylate

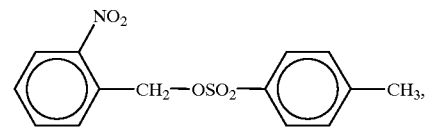

nitrobenzyltosylate

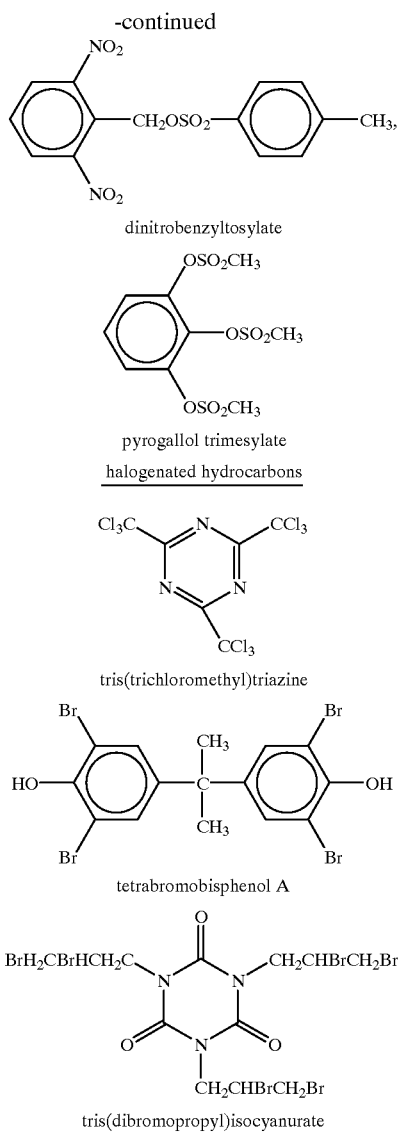

dinitrobenzyltosylate pyrogallol trimesylate halogenated hydrocarbons tris(trichloromethyl)triazine tetrabromobisphenol A tris(dibromopropyl)isocyanurate In addition to the above-described chemical amplification resist composition, the inventors have also found another type of novel chemical amplification resist composition which is characterized by simultaneously improved dissolution inhibiting function or capability and solubility in a resist solvent. The dissolution inhibitor used herein, as described above referring to the general formula (II), is constituted by the cyclic or acyclic structure A as a matrix structure of the inhibitor compound, the dissolution inhibiting group SIG and the linkage group L.

1. Improvement of the Dissolution Inhibiting Function or Capability

According to the present invention, the dissolution inhibiting function can be improved by using certain dissolution inhibitors containing two or more dissolution inhibiting groups in one molecule of the dissolution inhibitor compound, i.e., so-called "polyfunctional" type dissolution inhibitors. The contained dissolution inhibiting groups, as previously explained, are the substituent to be introduced in a molecule of the inhibitor compound, and said substituent is able to be decomposed upon action of an acid to thereby increase a solubility of the resist, while said substituents, before decomposition, can reduce the solubility of the resist.

More particularly, some typical examples of suitable dissolution inhibiting groups which can be advantageously introduced in the dissolution inhibitor in the practice of the present invention include the above-listed groups SIG-1 to SIG-10. Of course, if desired, other conventional dissolution inhibiting groups may be introduced in the dissolution inhibitor.

In the dissolution inhibitor, the above-mentioned dissolution inhibiting group may be preferably contained in an amount of three or more groups per one molecule of the inhibitor compound. Further, the molecule of the inhibitor compound should be preferably designed so that such dissolution inhibiting groups may be concentratedly distributed in a predetermined site on the molecule of the inhibitor compound.

The above-described dissolution inhibiting group has a low polarity and thus would have the effect of diminishing the solubility of the resist in an aqueous alkaline solution, if it was contained in the resist. Further, when an acid acts against said dissolution inhibiting group, said inhibiting group can be partially decomposed as shown in the below-mentioned formulae to thereby produce an acidic hydroxyl group or a carboxylic acid group:

A) decomposition of SIG-1 or SIG-3:

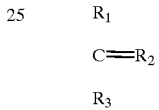

B) decomposition of SIG-2 or SIG-4:

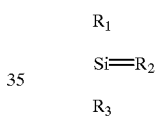

C) decomposition of SIG-5 or SIG-7:

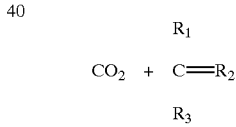

D) decomposition of SIG-6 or SIG-8:

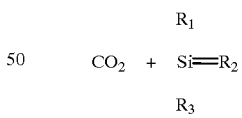

Note that in the above formulae, $R_1$, $R_2$ and $R_3$ are as defined above.

When it is released in the resist coating, the produced acidic hydroxyl group or carboxylic acid group can act to increase an alkali-solubility of the resist, contrary to the initial function of the dissolution inhibiting group (before decomposition thereof). Thus, an exposed area of the resist coating can be dissolved and removed with an aqueous alkaline solution (however, it is insoluble in an organic solvent) to form positive resist patterns. Alternatively, using an organic solvent in place of the aqueous alkaline solution as a developer, negative resist patterns can be produced.

For the present invention, when an acidic hydroxyl group or a carboxylic acid group is released in the resist coating, many dissolution inhibiting groups can be concentratedly distributed in the same molecule of the dissolution inhibitor, and thus use of a small amount of the dissolution inhibitor in the resist coating is sufficient to make the resist fully alkali-insoluble. Namely, the resist containing the present dissolution inhibitor can exhibit an increased dissolution inhibiting function or capability.

Figure 2A:
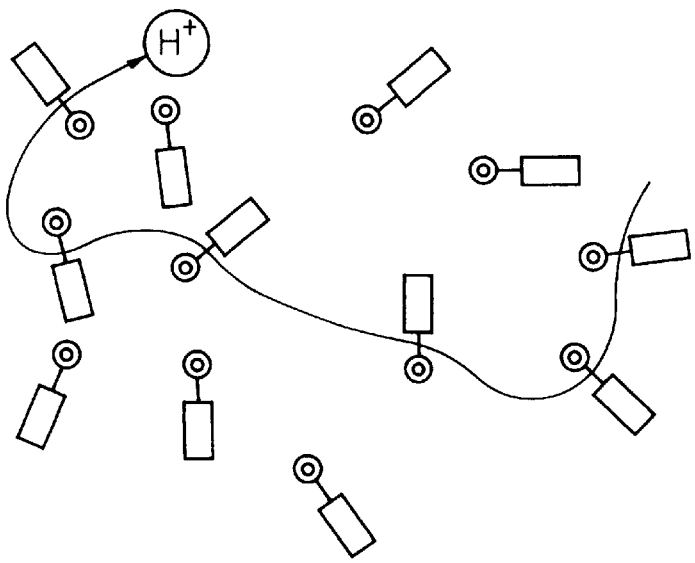
FIG. 2A is a schematic view showing the relationship between the number of the dissolution inhibiting groups in the dissolution inhibitor compound and the reaction distance of the chain reaction generated in the resist composition when said number of the dissolution inhibiting groups is relatively few.
Figure 2B:
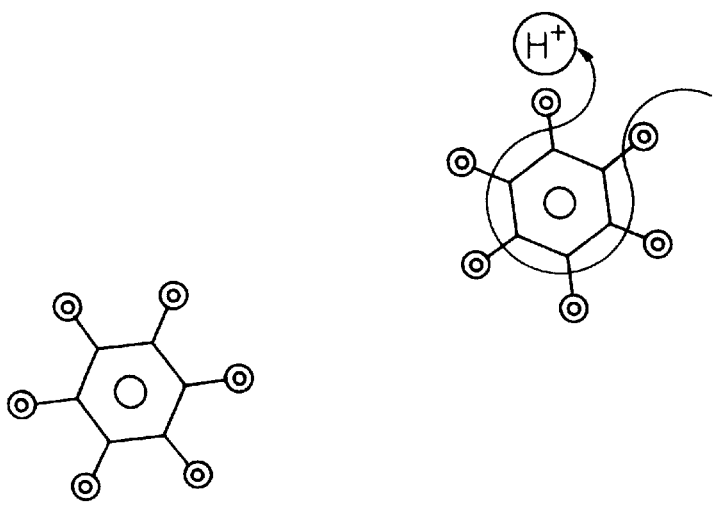
FIG. 2B is a schematic view showing the relationship between the number of the dissolution inhibiting groups in the dissolution inhibitor compound and the reaction distance of the chain reaction generated in the resist composition when the number of the dissolution inhibiting groups is relatively many.

Because of the above reason, as will be appreciated from FIG. 2B, the molecules of the dissolution inhibitor are widely disposed in the resist coating, and only a few of the molecules can participate in the above-mentioned chain reaction. Since substantially all of the molecules do not react, an extension of the reaction distance of the chain reaction can be avoided. Further, due to the presence of many dissolution inhibiting groups in one and the same molecule, the reduction in the area around of the chain reaction can be also avoided, while the range of the chain reaction can be shortened. Contrary to this, as shown in FIG. 2A, when a few of the dissolution inhibiting groups are contained in one molecule of the dissolution inhibitor, the range of the chain reaction can be remarkably extended. Note in FIGS. 2A and 2B that the chain reaction was made between six dissolution inhibiting groups, while the comparative compound (FIG. 2A) contains only one inhibiting group per molecule and the present compound (FIG. 2B) contains six inhibiting groups per molecule. Based on these mechanisms of the chain reaction, using the resist composition of the present invention, it becomes possible to increase the sensitivity of the resist as a result of rapid progress of the decomposition reaction, in addition to an increase in the resolution of the resist patterns. An increase in the throughput can be also expected.

The above effects will be further enhanced if the dissolution inhibitor compound is designed so that three or more adjacent dissolution inhibiting groups each can be concentratedly contained through four or less atoms in the molecule thereof.

One example of the suitable molecular design is as follows:

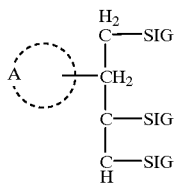

In the illustrated molecule of the dissolution inhibitor, the matrix structure A and three dissolution inhibiting groups SIG are bonded through the linkage group (CH$_2$), and the adjacent SIG groups are bonded through two or three (i.e., not more than four) atoms. In this instance, the atoms bridging the adjacent SIG groups are carbon atoms, however, of course, they may be replaced with any other atoms, if desired.

In this connection, reference can be made to Kwang-Duk Ahn et al., *Journal of Photopolymer Science and Technology*, Vol. 5, No. 1, 1992, pp. 67–77, entitled "A New Chemical Amplification Resist System Based on Novolac and t-BOC Protected Phosphazene as a Dissolution Inhibitor", in which a dissolution inhibitor containing six dissolution inhibiting groups is disclosed. However, the dissolution inhibitor has a large molecular size, because it is constituted from seven (7) 6-membered rings, and therefore the distance between the adjacent dissolution inhibiting groups is very long. In other words, using this chemical amplification system, excellent effects, comparable to those of the present invention, cannot be obtained.

In order to further improve the properties and functions of the dissolution inhibitor, it is preferred that at least one atom selected from the group consisting of an oxygen atom, a sulfur atom, a halogen atom (chlorine, fluorine, iodine or bromine), a nitrogen atom and a phosphorus atom is additionally contained in a suitable portion of the dissolution inhibitor compound exclusive of the dissolution inhibiting group portion. Preferably, said suitable portion is the matrix structure A of said general formula (II). The additional atoms, when they are contained in the structure A, can accelerate the formation of the hydrogen bond with the alkali-soluble base resin, because a lone pair retained in said additional atoms can gather acidic groups such as hydroxyl, carboxyl and other groups of the base resin around the molecule of the dissolution inhibitor. As a result, before the exposure thereof, the resist, as a whole, is only slightly soluble in an alkaline developer. Since the contrast is increased, a problem concerning the loss in the thickness of the resist coating can be removed. For to the same reason, similar effects can be obtained by introducing the above-described substituent group containing the double bonded oxygen atom in the molecule of the dissolution inhibitor compound. The effects rely upon the lone pair of the oxygen atom in the substituent group. The substituent group is particularly suitable for the induction of a hydrogen bond, because it tends to bias or shift electrons to a side of the oxygen atom in view of an electronegativity of said group.

2. Improvement of the Solubility in a Resist Solvent

Substantially all of the conventional and well-known dissolution inhibitors contain one or more aromatic rings in the molecule thereof. The aromatic ring is considered to be contained in the molecule of the inhibitor, because the conventional inhibitors are photodecomposable (not acid-decomposable). However, in principle, the dissolution inhibitor wherein an aromatic ring such as benzene ring or naphthalene ring is directly bonded to the dissolution inhibiting group has a tendency of showing a remarkably reduced solubility in the resist solvent. For example, the conventional dissolution inhibitor, 1,3,5-benzenetricarboxylic acid tri-t-butyl ester, can be dissolved in only a small amount (1%) in 100% of ethyl laurate. This is because the above dissolution inhibitor has a rigid molecular structure with a high symmetry, and therefore it can be only dissolved with difficulty in a resist solvent such as ethyl lactate, butyl acetate, propyleneglycol monoethylacetate and the like.

As a result of thorough study, the inventors have found that when the molecule of the dissolution inhibitor contains an aromatic ring or aromatic group as a matrix structure thereof, and also a dissolution inhibiting group is bonded to said aromatic ring or group, a rigid structure of said molecule can be effectively converted to a flexible structure by sandwiching one or more atoms between the aromatic ring or group and the dissolution inhibiting group. Alternatively, a saturated cyclic group may be introduced as a matrix structure to said molecule, in place of the aromatic ring or group. Typical examples of useful saturated cyclic groups include those listed above with regard to examples of the matrix structure A, for example, cyclooctyl ring, cycloheptyl ring, cyclohexyl ring, cyclopentyl ring and the like. In comparison with the aromatic ring or group, these cyclic groups have a better flexibility and a higher solubility in the resist solvent. In addition, these cyclic groups are suitable for photolithography, because they exhibit low absorption of ultraviolet radiation.

Another reason that the dissolution inhibitor containing an aromatic ring or group has been frequently used in the chemical amplification resists resides in a high resistance to etching due to the presence of said aromatic ring or group. However, a comparable resistance to etching can be also obtained when the present dissolution inhibitor containing the saturated cyclic ring is used in the resist composition. Further, since the polyfunctional dissolution inhibitor of the present invention can ensure a higher inhibiting effect with small amount of the same, it is not necessary to especially consider the etching resistance of the inhibitor itself. Furthermore, no problem is caused even if the matrix structure of the molecule of the inhibitor compound is constituted from a linear or chain-like group.

In addition, it should be noted that the presence of the oxygen, sulfur, halogen, nitrogen, and phosphorus atoms or double bonded oxygen atom-containing groups, which atoms and groups are effective to increase a dissolution inhibiting function of the inhibitors, is also effective to accelerate a solubility of the resists in a resist solvent such as ethyl lactate, butyl acetate and propyleneglycol monoethylacetate, since said atoms and groups can induce a salvation of the resists. Also, the precipitation of the dissolution inhibitor or similar problems can be avoided. Especially, it is preferred that a saturated cyclic ring is introduced as a matrix structure into the molecule of the dissolution inhibitor, and also the above-mentioned oxygen, sulfur, halogen, nitrogen or phosphorus atoms and/or double bonded oxygen atom-containing groups are bonded to said matrix structure. For example, suitable saturated cyclic rings include tetrahydrofuranyl ring, tetrahydrothiophenyl ring, dioxanyl ring, cyclooctanonyl ring, cycloheptanonyl ring, cyclohexanonyl ring, cyclopentanonyl ring, cyclobutanonyl ring, butylolactone ring, piperidinyl ring, piperadinyl ring and other rings.

In the above, the present resist compositions were described to explain their usefulness in improving both the dissolution inhibiting function and the solubility in a resist solvent. The dissolution inhibitors which can be advantageously used in these resist compositions, although they are not restricted to the below-mentioned, include the following compounds, for example. Note in the below-mentioned formulae that SIG represents a dissolution inhibiting group, and Me represents a methyl group.

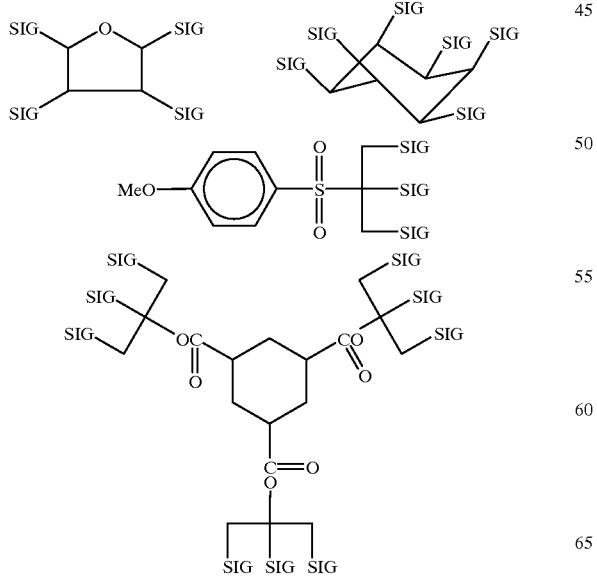

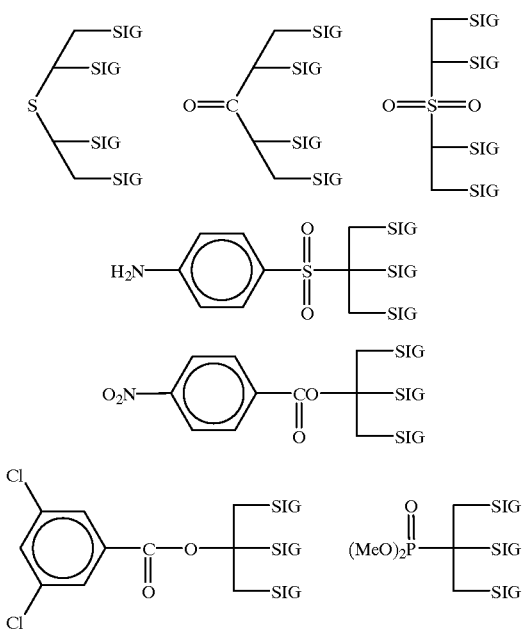

More particularly, the above-mentioned dissolution inhibitor compounds include the following compounds in which tBu represents a t-butyl group.

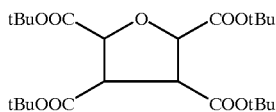

SIA-6

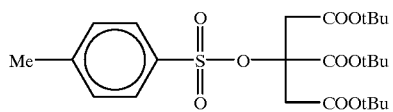

SIA-7

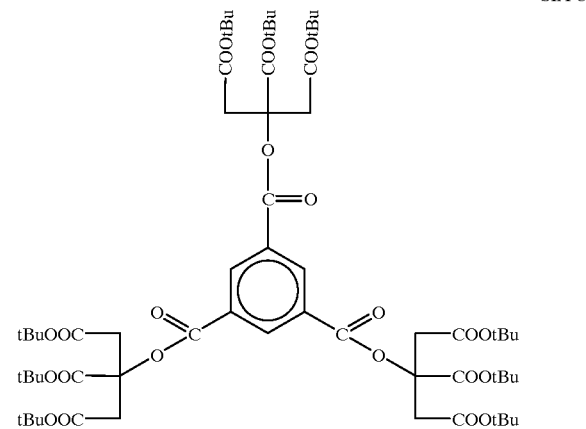

SIA-8

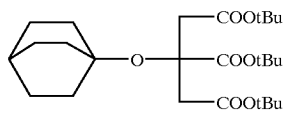

SIA-9

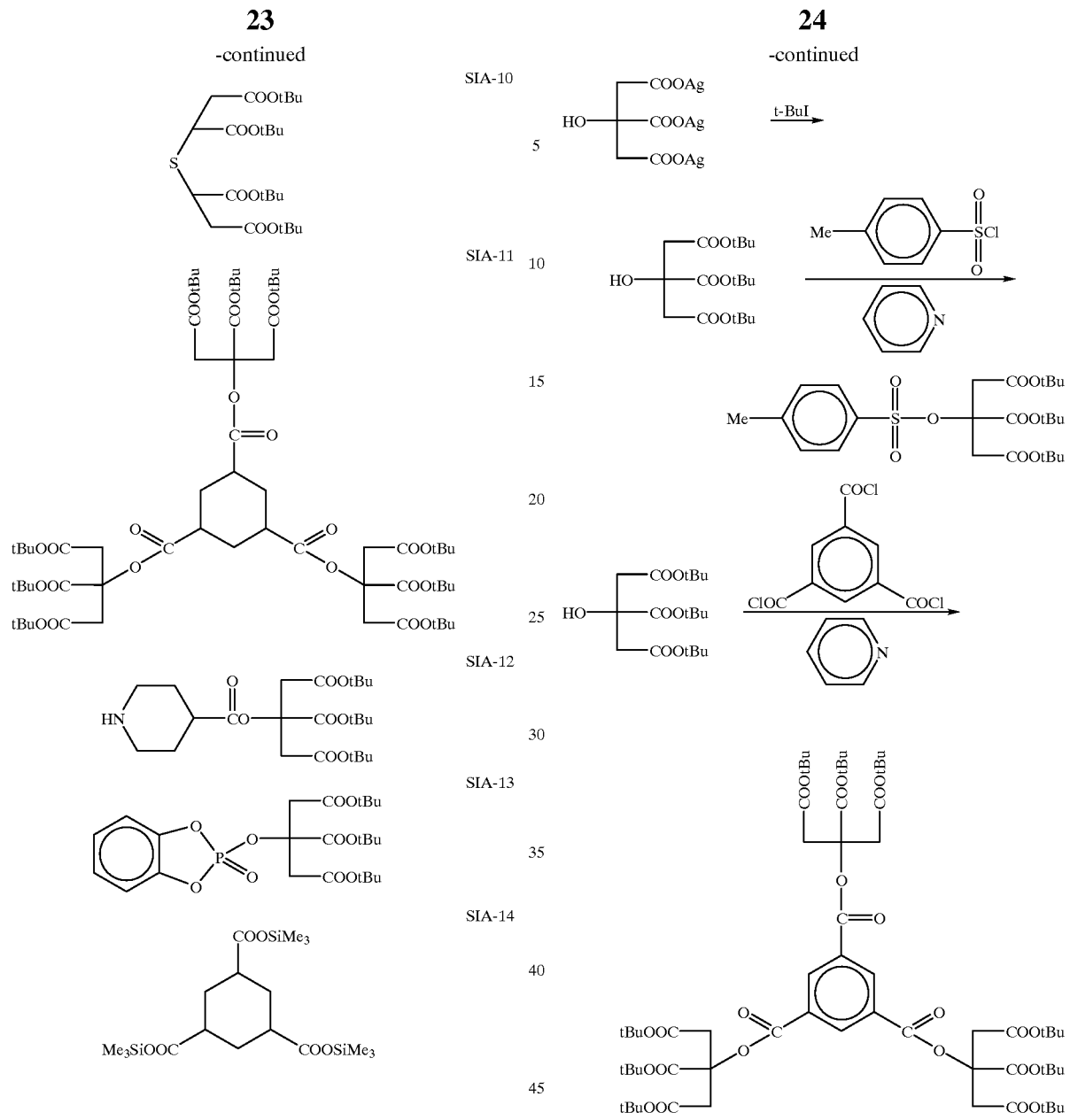
Further, the above-mentioned dissolution inhibitor compounds SIA-6 to SIA-14 each can be produced from the following reaction scheme in accordance with the conventional production process.
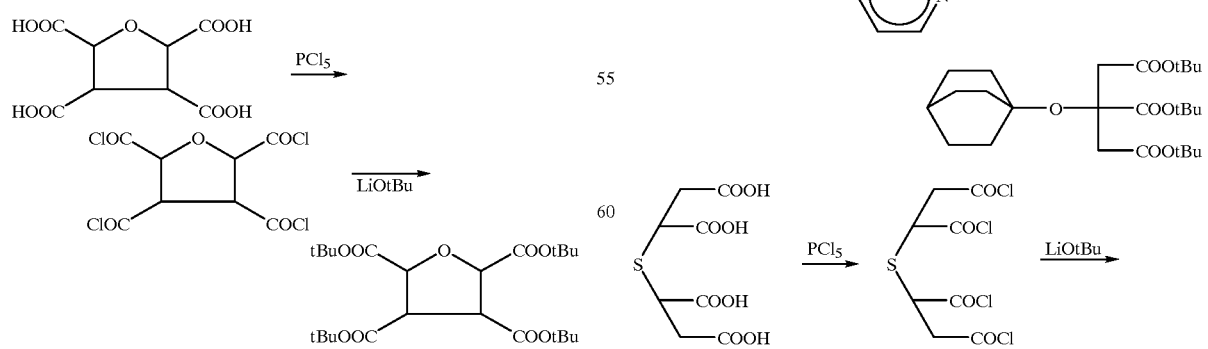

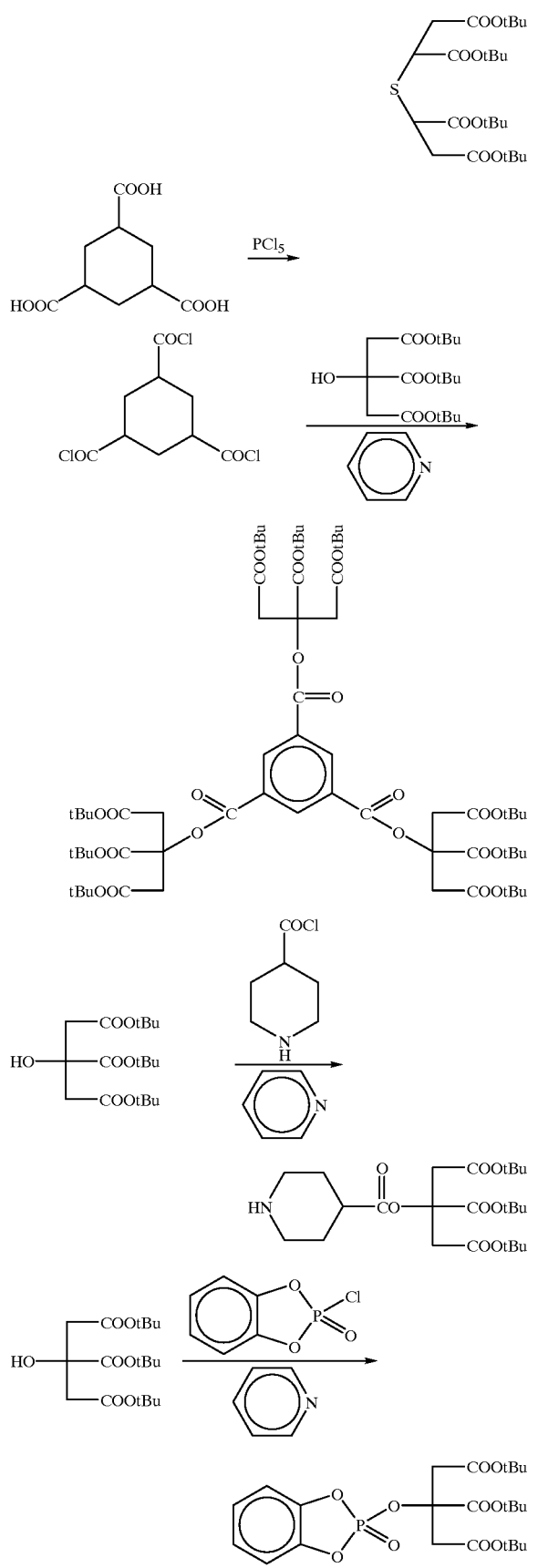
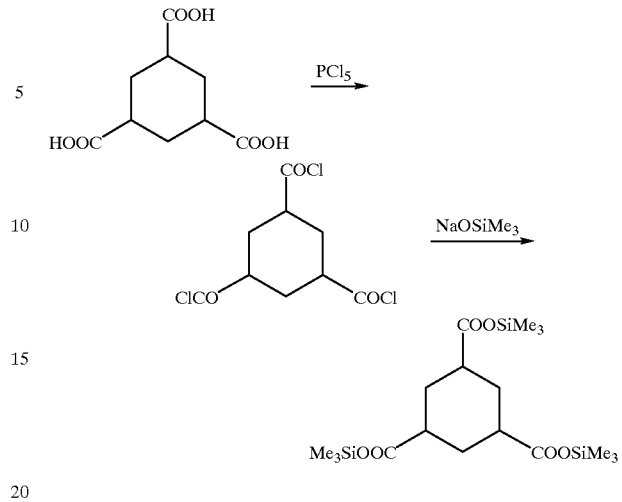

Further, the alkali-soluble base resin and the photoacid generator used in combination with said dissolution inhibitor in the resist composition are also not restricted in the practice of the present invention. Accordingly, any suitable resin and compound may be used alone or in combination by freely selecting suitable materials from conventional base resins and photoacid generators well-known in the field of resist chemistry. The typical examples of suitable base resins and photoacid generators have been already described, and accordingly the duplicated descriptions will be omitted herein.

In addition to the above-mentioned chemical amplification resist compositions, the inventors have also found still another type of novel chemical amplification resist composition. The present chemical amplification resist composition, as will be appreciated from the below-mentioned descriptions, is characterized by using a high quality dissolution inhibitor capable of controlling an alkali solubility of the composition. The dissolution inhibitor used herein is represented by the general formula (III), and comprises a cyclic or acyclic structure A as a matrix structure and a dissolution inhibiting group SIG.

To attain the object that polar groups of the alkali-soluble base resin should be attracted through a hydrogen atom to a side of the dissolution inhibitor while avoiding a reduction in the dissolution inhibiting function, the inventors have studied and found that the satisfactory results can be obtained if halogen atom(s) are contained in the dissolution inhibitor. When the halogen atom(s) are contained in the dissolution inhibitor, a satisfactory dissolution inhibiting function can be accomplished, because a sufficient level of the hydrogen bond can be induced, while controlling the polarity of the inhibitor molecule itself to a relatively low level. The introduction of the halogen atom(s) into the inhibitor molecule can be advantageously accomplished by using different methods, however, the inventors have found that if the halogen atom(s) are contained in the dissolution inhibiting group of the inhibitor molecule, the dissolution inhibiting function can be effectively increased, because the polar group of the alkali-soluble base resin is effectively blocked by said halogen atom(s). Typical examples of the particularly suitable dissolution inhibiting groups include the groups SIG-11 to SIG-14 which were above described with reference to the general formulae thereof. These SIG groups contain the substituents $R_5$, $R_6$ and $R_7$, and at least one of these substituents is a halogenated alkyl group of 3 or less carbon atoms, for example, a chlorinated methyl group, a chlorinated ethyl group or others. The remainder of these substituents may be optional, and they may be, for example, a hydrogen atom or a group similar to the above-described $R_1$, $R_2$ and $R_3$ groups.

In the practice of the present invention, to obtain a satisfactory dissolution inhibiting function, it is preferred that at least three of the above-described dissolution inhibiting groups SIG 11 to SIG-14 are contained in one molecule of the dissolution inhibitor. Fewer dissolution inhibiting groups will cause a reduction in the contrast as a result of the diminished difference in the dissolution speed before and after the decomposition of the inhibitor.

Further, generally, a ratio of the hydrogen atoms to the halogen atoms in one substituent group such as SIG-11 to SIG-14 is preferably in the range of 15:1 to 1:1. If the halogen atom is contained in an amount less than a ratio of 15:1, the above-mentioned effects for accelerating the hydrogen bond will not be induced. On the contrary, the halogen atom in an amount beyond the ratio of 1:1 will not easily induce the chemical amplification effect due to the lack of hydrogen atoms. Namely, as will be appreciated from the phenomenon of protons in the below-mentioned scheme of the acidic decomposition reaction, the hydrogen atom in the acid-decomposable dissolution inhibiting group can be a source of acid having a catalytic function.

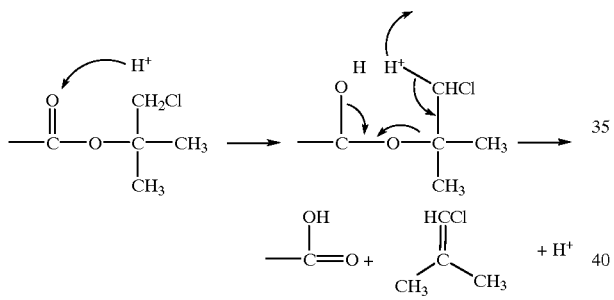

The above-described dissolution inhibiting group may be directly or indirectly bonded to any cyclic or acyclic matrix structure to form a dissolution inhibitor. Suitable matrix structures include, for example, the above-listed cyclic structures, particularly benzophenone, adamantane or cyclohexanone. These matrix structures can exhibit an excellent resistance to etching.

The dissolution inhibitors which can be advantageously used in the practice of the present invention, although they are not restricted to the below-mentioned, include the following compounds, for example:

SIA-15

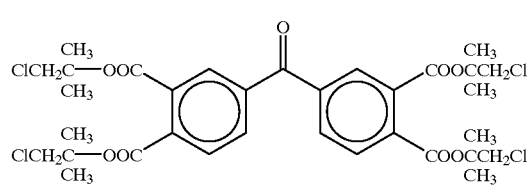

SIA-16

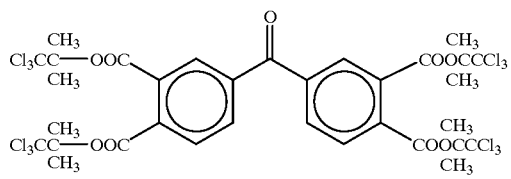

SIA-17

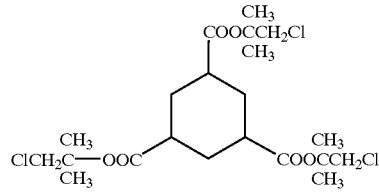

SIA-18

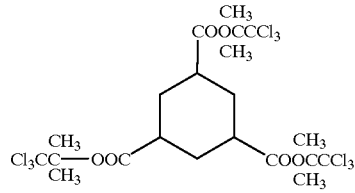

Further, the above-mentioned dissolution inhibitor compounds SIA-15 to SIA-18 each can be produced from the following reaction scheme in accordance with the conventional production process.

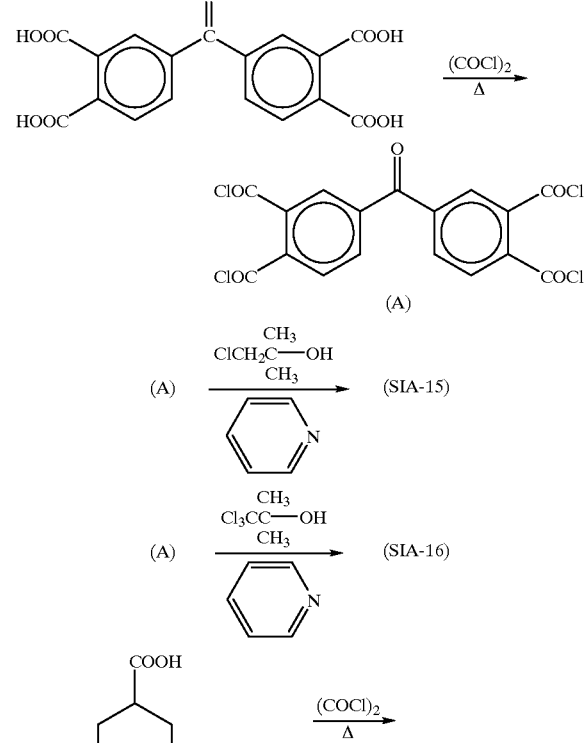

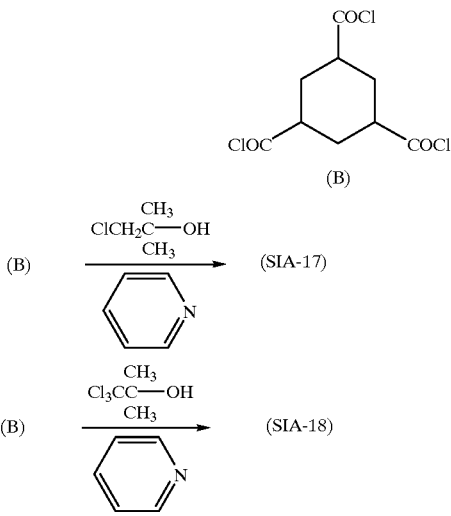

Further, the alkali-soluble base resin used in combination with the above-described dissolution inhibitor may be freely selected from conventional base resins well-known in the field of resist chemistry, and it may be used alone or in combination. The typical examples of suitable base resins have been already described, and accordingly a duplicated description will be omitted herein. Similarly, the photoacid generator has been already described, and any suitable photoacid generator can be optionally selected from the above-listed or other conventional photoacid generators. Preferably, the photoacid generator is a sulfonium salt compound, an iodonium salt compound, a benzyl tosylate or a halogen-containing organic compound.

In the chemical amplification resist composition according to the present invention, the amount of the above-described base resin, photoacid generator and dissolution inhibitor added may be widely varied depending upon various factors. For example, assuming that the amount of the base resin in the resist composition amounts to 100% by weight, the amount of the photoacid generator is preferably about 1 to 30% by weight, and the amount of the dissolution inhibitor is preferably about 5 to 40%. If desired, the photoacid generator and dissolution inhibitor may be added in an amount out of the described range of the amount added to the resist composition.

In addition to the base resin, the photoacid generator and the dissolution inhibitor, the chemical amplification resist composition of the present invention may contain any additional components, if they are appropriate to improve the properties or others of the resist composition. Suitable additional components include, for example, a surfactant for improving a coatability of the composition, a sensitizer for improving a sensitivity of the composition and a light-absorbing dye for improving the configuration of the resulting resist patterns.

Generally, the resist composition according to the present invention can be advantageously used as a resist solution after the above-described components are dissolved in a suitable resist solvent. The resist solvent used in the preparation of the resist solution can be widely varied depending upon various factors such as the components of the resist composition, coating conditions of the resist solution and the like, and typical examples of suitable resist solvents, although they are not restricted to the below-mentioned, include ethyl lactate, cyclohexanone, propyleneglycol monomethyletheracetate (PGMEA) and similar solvents. These resist solvents may be used alone or, if desired, may be used as a mixture of two or more solvents. The amount of the resist solvent used is not restricted.

In addition, the present invention is directed to a process for forming resist patterns on a substrate. The pattern formation process according to the present invention can be carried out in the manner based on conventional lithographic processes, however, as previously mentioned, the present process must use the novel chemical amplification resist composition of the present invention. Using the chemical amplification resist composition of the present invention, fine or very fine resist patterns which are excellent in both of the sensitivity and resolution can be produced on a substrate to be fabricated.

Preferably, the pattern formation process of the present invention may be carried out by using a series of the following steps. Namely, the above-described chemical amplification resist composition is coated on a substrate to be fabricated, and then the resulting resist coating is selectively exposed to a patterning radiation capable of causing a decomposition of the dissolution inhibitor compound in the resist composition, preferably ionized radiation, and then the exposed resist coating is developed with an aqueous alkaline solution. The resist pattern formed herein may be either a single layer resist pattern or a multilayered resist pattern. In the latter, a two-layered resist pattern can be advantageously formed by using a silicone resist as an upper resist and the present resist composition as a lower resist.

In the practice of the present patterning process, the resist composition of the present invention is first coated on a substrate to be fabricated, to thereby form a resist coating. The substrate used herein may be any conventional substrate used in the field of semiconductor devices and other devices, and typical examples of suitable substrates include a silicon substrate, an aluminum substrate, a glass substrate, a SOS substrate, a non-magnetic substrate, coatings such as oxide, polysilicon and nitride, and the like. If desired, the substrate may additionally contain one or more overlaying layers such as a silicon oxide layer, metallic wiring layer, insulating interlayer, magnetic layer and the like. Further, the substrate and/or the overlaying layer(s) may contain elements such as wiring or circuits fabricated therein. Furthermore, in order to increase an adhesion strength of the resist coating to the substrate, a surface of the substrate may be subjected to a conventional hydrophobic treatment. Typical examples of the chemicals advantageously used in this treatment are 1,1,1,3,3,3-hexamethyldisilazane (HMDS) and the like.

Coating of the resist composition can be made from a resist solution containing the same composition as set forth in the above paragraphs. The resist solution can be preferably coated over the substrate surface by spin-coating, although any other conventional coating method such as roller coating and dip coating may be used, if desired. The layer thickness of the resist coating is preferably in the range of about 0.3 to 2.0 $\mu$m. Note, however, that the layer thickness of the resist coating may be varied depending upon different factors such as the intended use of the resulting resist patterns.

The resist coating formed on the substrate is generally, and preferably, prebaked at a temperature of about 60 to 150° C., more preferably about 60 to 100° C., for about 60 to 180 seconds, before selective exposure of the coating to patterning radiation. Prebaking may be carried out by using any heating means conventionally used in a resist process. Suitable heating means include, for example, a hot plate, infrared (IR) heating oven, microwave heating oven and the like.

If desired, a top coat or protective coating may be applied over the resist coating. For example, the top coat can be formed by spin-coating a solution of olefinic resin and then baking the coating at a temperature of about 100° C.

After prebaking, the prebaked resist coating is selectively exposed to a patterning radiation in conventional exposure devices or aligners. Suitable exposure devices include commercially available devices such as ultraviolet (far UV or vacuum UV) exposure devices, X-ray exposure devices, electron beam exposure systems and excimer steppers, for example. The conditions of exposure can be varied to select the optimum condition in each process, taking various factors into consideration. As a result of selective exposure, an acid is released from the photoacid generator in the resist coating, followed by decomposition of the dissolution inhibitor.

Thereafter, the exposed resist coating is subjected to a post-exposure baking (PEB) step to thereby cause a cleavage reaction of the protective group in the presence of an acid as a catalyst. The post-exposure baking may be carried out as in the above-mentioned prebaking step. For example, a temperature of the post-exposure baking is about 60 to 150° C., preferably about 100 to 150° C. If the top coat has been applied over the resist coating, it is necessary to remove it with any remover such as organic solvent after the post-exposure baking and before development.

As a final step of the present process, the baked resist coating is developed with an aqueous alkaline solution in accordance with any conventional method. Suitable apparatuses for use in this development step include well-known developers such as a spin developer, dip developer and spray developer. Further, typical examples of the aqueous alkaline solution suitable as the developer include an aqueous solution of hydroxide of metals belonging to the groups I and II of the periodic table such as potassium hydroxide or an aqueous solution of organic bases free from metal ions such as tetraalkylammonium hydroxide, for example, tetramethylammonium hydroxide (TMAH), tetraethylammonium hydroxide (TEAH) and tetrabuthylammonium hydroxide (TBAH). More preferably, tetramethylammonium hydroxide (TMAH) can be used as the developer. The amount or concentration of the ammonium or other alkaline developer used may be widely varied, however, generally, the concentration is preferably about 0.1 to 15% by weight, more preferably about 1 to 10% by weight. Similarly, the developing time is not restrictive, and generally it is preferably about 1 to 5 minutes, more preferably about 1 to 3 minutes. As a result of the development, an exposed area of the resist coating is dissolved off to obtain the desired fine positive resist patterns. The resist patterns are rinsed with pure water and then dried in accordance with the conventional method.

EXAMPLES

The present invention will be further described with reference to the appended working examples. Note, however, that the examples are appended herein for only for the purpose of explanation and they do not restrict the present invention. In the below-mentioned tables, the amount of the dissolution inhibitor (SIA) added is indicated with "% by weight" based on the amount of the base resin.

Example 1
Preparation of Dissolution Inhibitor SIA-1

3.7 g (0.013 mole) of $BF_3 \cdot Et_2O$ was added to a mixture of 25 g (0.064 mole) of chlorendic acid and 150 g (0.64 mole) of t-butyl acetate, and stirred at a room temperature for 24 hours. Thereafter, sodium hydrogencarbonate was added to neutralize the solution which was then washed with water and dried on magnesium sulfate. The remaining t-butyl acetate was removed on an evaporator. The resulting raw product was recrystallized from methanol to obtain the desired dissolution inhibitor SIA-1.

Formation of Resist Patterns

The dissolution inhibitor SIA-1 prepared in the above step was dissolved, along with 1 g of the base resin described in the following Table 1 and 0.05 g of the photoacid generator, triphenylsulfonium trifulate, in 9 g of ethyl lactate, and then filtered on a 0.2 μm membrane filter. The resulting resist solution was coated at a thickness of 0.7 μm on a silicon wafer, and dried. The resulting sample of the resist coating was patternwise exposed to each of i-line, KrF excimer laser and electron beam (EB) radiation in accordance with a conventional method. Immediately after exposure, the sample was postbaked at 90° C. for 2 minutes on a hot plate, and then dip-developed for one minute in an aqueous solution of 2.38% tetramethylammonium hydroxide (TMAH). Positive resist patterns were thus obtained.

The resulting resist patterns were then evaluated with regard to the sensitivity and the resolution. The results are summarized in the following Table 1.

TABLE 1

| base resin | amount of SIA added | sensitivity (EB: μC/cm$^2$, others: mJ(cm$^2$)) | | | resolution (L&S, μm) | | |
| --- | --- | --- | --- | --- | --- | --- | --- |
| | | I-line | KrF ex-cimer | EB | I-line | KrF ex-cimer | EB |
| m/p-cresol-novolak (Mw = 3.0 × 10$^3$) | 5% | 20 | 15 | 2 | 0.4 | 0.3 | 0.2 |
| phenol-novolak (Mw = 4.2 × 10$^3$) | 5% | 15 | 25 | 2 | 0.4 | 0.3 | 0.2 |
| polyhydroxystyrene (Mw = 5.0 × 10$^3$) | 10% | 15 | 15 | 1.7 | 0.4 | 0.3 | 0.15 |
| acetylated polysilphenylene siloxane (Mw = 2.0 × 10$^5$) | 5% | 30 | 45 | 2 | 0.4 | 0.3 | 0.1 |
| acetylated polysiloxane (Mw = 1.2 × 10$^5$) | 5% | 20 | 35 | 3 | 0.4 | 0.3 | 0.2 |

The above results indicate that all the resist samples can exhibit high sensitivity and high resolution. The less difference in the size between the resulting patterns and the mask or EB means the shortened distance of the chain reaction. A very small amount (10% or less) of SIA-1 is sufficient to obtain a satisfactory dissolution inhibiting function.

Example 2
Preparation of Dissolution Inhibitor SIA-2

2.2 g (0.02 mole) of t-butoxy potassium in 50 ml of tetrahydrofuran (THF) was dropwise added to 2.3 g (0.01 mole) of 2,3-dichloro-1,4-naphthoquinone in 200 ml of tetrahydrofuran, with stirring at room temperature for 2 hours. The product was extracted with ether to obtain the desired dissolution inhibitor SIA-2.

Formation of Resist Patterns

The procedure of Example 1 was repeated using the dissolution inhibitor SIA-2 prepared in the above step. The resist solution was prepared, followed by pattern formation.

The resulting resist patterns were then evaluated with regard to the sensitivity and the resolution. The results are summarized in the following Table 2.

TABLE 2

| base resin | amount of SIA added | sensitivity (EB: $\mu C/cm^2$, others: $mJ/cm^2$) | | | resolution (L&S, $\mu m$) | | |
|---|---|---|---|---|---|---|---|
| | | I-line | KrF excimer | EB | I-line | KrF excimer | EB |
| m/p-cresol-novolak (Mw = 3.0 × 10³) | 5% | 20 | 25 | 2 | 0.4 | 0.3 | 0.15 |
| phenol-novolak (Mw = 4.2 × 10³) | 5% | 15 | 25 | 3 | 0.4 | 0.3 | 0.15 |
| polyhydroxystyrene (Mw = 5.0 × 10³) | 5% | 20 | 30 | 4 | 0.4 | 0.3 | 0.15 |
| acetylated polysilphenylene siloxane (Mw = 2.0 × 10⁵) | 5% | 15 | 25 | 4 | 0.4 | 0.3 | 0.15 |
| acetylated polysiloxane (Mw = 1.2 × 10⁵) | 5% | 15 | 15 | 3 | 0.4 | 0.3 | 0.15 |

The above results indicate that all the resist samples can exhibit high sensitivity and high resolution.

Example 3
Preparation of Dissolution Inhibitor SIA-3

0.96 g (0.01 mole) of lithium trimethylsilanolate in 50 ml of THF was dropwise added to 2.3 g (0.01 mole) of 3,4,5-trimethoxy benzoic chloride in 300 ml of THF, with stirring at room temperature for 2 hours. Thereafter, the product was filtered to remove the solvent, and washed with water to obtain the desired dissolution inhibitor SIA-3.

Formation of Resist Patterns

The procedure of Example 1 was repeated using the dissolution inhibitor SIA-3 prepared in the above step. The resist solution was prepared, followed by pattern formation.

The resulting resist patterns were then evaluated with regard to the sensitivity and the resolution. The results are summarized in the following Table 3.

TABLE 3

| base resin | amount of SIA added | sensitivity (EB: $\mu C/cm^2$, others: $mJ/cm^2$) | | | resolution (L&S, $\mu m$) | | |
|---|---|---|---|---|---|---|---|
| | | I-line | KrF excimer | EB | I-line | KrF excimer | EB |
| m/p-cresol-novolak (Mw = 3.0 × 10³) | 5% | 35 | 30 | 6 | 0.4 | 0.3 | 0.15 |
| phenol-novolak (Mw = 4.2 × 10³) | 5% | 25 | 30 | 2 | 0.4 | 0.3 | 0.15 |
| polyhydroxystyrene (Mw = 5.0 × 10³) | 5% | 25 | 25 | 2 | 0.4 | 0.3 | 0.2 |
| acetylated polysilphenylene siloxane (Mw = 2.0 × 10⁵) | 5% | 25 | 30 | 3 | 0.4 | 0.3 | 0.15 |
| acetylated polysiloxane (Mw = 1.2 × 10⁵) | 5% | 20 | 10 | 3.5 | 0.4 | 0.3 | 0.2 |

The above results indicate that all the resist samples can exhibit high sensitivity and high resolution.

Example 4
Preparation of Dissolution Inhibitor SIA-4

5.6 g (0.02 mole) of triphenyl methyl chloride in 50 ml of THF was dropwise added to a mixture of 1.1 g (0.01 mole) of 3,4-dihydroxy-3-cyclobutene-1,2-dione, 1.6 g (0.02 mole) of pyridine and 200 ml of THF, with stirring at room temperature for 2 hours. Thereafter, the product was filtered to remove the solvent, and washed with water to obtain the desired dissolution inhibitor SIA-4.

Formation of Resist Patterns

The procedure of Example 1 was repeated using the dissolution inhibitor SIA-4 prepared in the above step. The resist solution was prepared, followed by pattern formation.

The resulting resist patterns were then evaluated with regard to the sensitivity and the resolution. The results are summarized in the following Table 4.

TABLE 4

| base resin | amount of SIA added | sensitivity (EB: $\mu C/cm^2$, others: $mJ/cm^2$) | | | resolution (L&S, $\mu m$) | | |
|---|---|---|---|---|---|---|---|
| | | I-line | KrF excimer | EB | I-line | KrF excimer | EB |
| m/p-cresol-novolak (Mw = 3.0 × 10³) | 5% | 40 | 30 | 7 | 0.4 | 0.3 | 0.15 |
| phenol-novolak (Mw = 4.2 × 10³) | 5% | 20 | 30 | 6 | 0.4 | 0.3 | 0.2 |
| polyhydroxystyrene (Mw = 5.0 × 10³) | 10% | 30 | 50 | 5 | 0.4 | 0.3 | 0.2 |
| acetylated polysilphenylene siloxane (Mw = 2.0 × 10⁵) | 5% | 25 | 40 | 2 | 0.4 | 0.3 | 0.15 |
| acetylated polysiloxane (Mw = 1.2 × 10⁵) | 5% | 20 | 30 | 4 | 0.4 | 0.3 | 0.15 |

The above results indicate that all the resist samples can exhibit high sensitivity and high resolution.

Further, the above procedure was repeated with the proviso that 0.05 g of 2,6-dinitrobenzyl tosylate was used in place of 0.05 g of triphenylsulfonium trifulate as the photoacid generator. The sensitivity and dissolution of the resulting resist patterns are summarized in the following Table 5.

TABLE 5

| base resin | amount of SIA added | sensitivity (EB: $\mu C/cm^2$, others: $mJ/cm^2$) | | | resolution (L&S, $\mu m$) | | |
|---|---|---|---|---|---|---|---|
| | | I-line | KrF excimer | EB | I-line | KrF excimer | EB |
| m/p-cresol-novolak (Mw = 3.0 × 10³) | 5% | 20 | 20 | 4 | 0.4 | 0.3 | 0.2 |
| phenol-novolak (Mw = 4.2 × 10³) | 5% | 20 | 25 | 3.5 | 0.4 | 0.3 | 0.15 |
| polyhydroxystyrene (Mw = 5.0 × 10³) | 10% | 35 | 20 | 3 | 0.4 | 0.3 | 0.15 |
| acetylated polysilphenylene siloxane (Mw = 2.0 × 10⁵) | 5% | 35 | 30 | 4 | 0.4 | 0.3 | 0.15 |
| acetylated polysiloxane (Mw = 1.2 × 10⁵) | 5% | 35 | 40 | 5 | 0.4 | 0.3 | 0.2 |

Example 5
Preparation of Dissolution Inhibitor SIA-6

2.5 g (0.01 mole) of tetrahydrofuran-2,3,4,5-tetracarboxylate and 8.3 g (0.04 mole) of phosphorus pentachloride were stirred along with 100 ml of chlorobenzene for 45 minutes under the flow of nitrogen gas, and the mixture was gradually heated to 100° C., and stirred for 6 hours. Thereafter, the solution was heated to 110° C., the produced phosphoryl chloride (POCl$_3$) was removed, and then chlorobenzene was distilled off under the reduced pressure. The thus prepared tetrahydrofuran-2,3,4,5-tetracarboxyl chloride was dissolved in THF, and dropwise added to 3.2 g (0.04 mole) of lithium t-butoxide in 300 ml of THF under the flow of nitrogen gas. Thereafter, the solvent was removed, extracted with ether, and washed with water to obtain the desired dissolution inhibitor SIA-6.

Formation of Resist Patterns

The dissolution inhibitor SIA-6 prepared in the above step was dissolved, along with 1 g of the base resin described in the following Table 6 and 0.05 g of the photoacid generator, triphenylsulfonium trifulate, in 9 g of ethyl lactate, and then filtered on a 0.2 μm membrane filter. The resulting resist solution was coated at a thickness of 0.7 μm on a silicon wafer, and dried. The resulting sample of the resist coating was patternwise exposed to each of i-line, KrF excimer laser and electron beam (EB) radiation in accordance with the conventional method. Immediately after exposure, the sample was postbaked at 90° C. for 2 minutes on a hot plate, and then dip-developed for one minute in an aqueous solution of 2.38% tetramethylammonium hydroxide (TMAH). Positive resist patterns were thus obtained.

The resulting resist patterns were then evaluated with regard to the sensitivity and the resolution. The results are summarized in the following Table 6.

TABLE 6

| base resin | amount of SIA added | sensitivity (EB: μC/cm$^2$, others: mJ(cm$^2$)) | | | resolution (L&S, μm) | | |
|---|---|---|---|---|---|---|---|
| | | I-line | KrF excimer | EB | I-line | KrF excimer | EB |
| m/p-cresol-novolak (Mw = 3.0 × 10$^3$) | 5% | 20 | 20 | 2 | 0.4 | 0.3 | 0.2 |
| phenol-novolak (Mw = 4.2 × 10$^3$) | 5% | 15 | 25 | 2 | 0.4 | 0.3 | 0.2 |
| polyhydroxystyrene (Mw = 5.0 × 10$^3$) | 10% | 15 | 15 | 1.7 | 0.4 | 0.3 | 0.15 |
| acetylated polysilphenylene siloxane (Mw = 2.0 × 10$^5$) | 5% | 30 | 30 | 2 | 0.4 | 0.3 | 0.1 |
| acetylated polysiloxane (Mw = 1.2 × 10$^5$) | 5% | 20 | 25 | 3 | 0.4 | 0.3 | 0.2 |

The above results indicate that all the resist samples can exhibit high sensitivity and high resolution. The less difference in the size between the resulting patterns and the mask or EB means the shortened distance of the chain reaction. A very small amount (10% or less) of SIA-6 is sufficient to obtain a satisfactory dissolution inhibiting function.

Example 6
Preparation of Dissolution Inhibitor SIA-7

5.5 g (0.03 mole) of t-butyl iodide was dropwise added to 5.1 g (0.01 mole) of silver citrate in 200 ml of ether, and stirred at a room temperature for 2 hours. The product was extracted with ether. Thereafter, 5.7 g (0.03 mole) of tosyl chloride in 50 ml of THF was dropwise added to a mixed solution of the resulting citric acid tri-t-butyl ester, 2.4 g (0.03 mole) of pyridine and 300 ml of THF, and stirred at a room temperature for 2 hours. Thereafter, the mixture was filtered to remove the solvent, and washed with water to obtain the desired dissolution inhibitor SIA-7.

Formation of Resist Patterns

The procedure of Example 5 was repeated using the dissolution inhibitor SIA-7 prepared in the above step. The resist solution was prepared, followed by pattern formation.

The resulting resist patterns were then evaluated with regard to the sensitivity and the resolution. The results are summarized in the following Table 7.

TABLE 7

| base resin | amount of SIA added | sensitivity (EB: μC/cm$^2$, others: mJ(cm$^2$)) | | | resolution (L&S, μm) | | |
|---|---|---|---|---|---|---|---|
| | | I-line | KrF excimer | EB | I-line | KrF excimer | EB |
| m/p-cresol-novolak (Mw = 3.0 × 10$^3$) | 5% | 25 | 25 | 2 | 0.4 | 0.3 | 0.15 |
| Phenol-novolak (Mw = 4.2 × 10$^3$) | 5% | 15 | 25 | 3.5 | 0.4 | 0.3 | 0.15 |
| polyhydroxystyrene (Mw = 5.0 × 10$^3$) | 5% | 20 | 25 | 4 | 0.4 | 0.3 | 0.15 |
| acetylated polysilphenylene siloxane (Mw = 2.0 × 10$^5$) | 5% | 10 | 25 | 5 | 0.4 | 0.3 | 0.15 |
| acetylated polysiloxane (Mw = 1.2 × 10$^5$) | 5% | 15 | 35 | 3 | 0.4 | 0.3 | 0.2 |

The above results indicate that all the resist samples can exhibit high sensitivity and high resolution.

Example 7
Preparation of Dissolution Inhibitor SIA-8

A solution of 2.7 g (0.01 mole) of benzene tricarboxyl chloride in 50 ml of THF was dropwise added to a mixed solution of 10.8 g (0.03 mole) of citric acid tri-t-butyl ester prepared in Example 6, 2.4 g (0.03 mole) of pyridine and 300 ml of THF at a room temperature, and stirred for 2 hours. Thereafter, the mixture was filtered to remove the solvent, and washed with water to obtain the desired dissolution inhibitor SIA-8.

Formation of Resist Patterns

The procedure of Example 5 was repeated using the dissolution inhibitor SIA-8 prepared in the above step. The resist solution was prepared, followed by pattern formation.

The resulting resist patterns were then evaluated with regard to the sensitivity and the resolution. The results are summarized in the following Table 8.

TABLE 8

| base resin | amount of SIA added | sensitivity (EB: μC/cm$^2$, others: mJ(cm$^2$)) | | | resolution (L&S, μm) | | |
|---|---|---|---|---|---|---|---|
| | | I-line | KrF excimer | EB | I-line | KrF excimer | EB |
| m/p-cresol-novolak (Mw = 3.0 × 10$^3$) | 5% | 35 | 40 | 2 | 0.4 | 0.3 | 0.15 |
| phenol-novolak (Mw = 4.2 × 10$^3$) | 5% | 25 | 30 | 2.3 | 0.4 | 0.3 | 0.15 |
| polyhydroxystyrene (Mw = 5.0 × 10$^3$) | 5% | 25 | 15 | 2 | 0.4 | 0.3 | 0.1 |
| acetylated polysilphenylene siloxane (Mw = 2.0 × 10$^5$) | 5% | 15 | 30 | 3 | 0.4 | 0.3 | 0.2 |
| acetylated | 5% | 20 | 30 | 1.5 | 0.4 | 0.3 | 0.2 |

TABLE 8-continued

| base resin | amount of SIA added | sensitivity (EB: $\mu C/cm^2$, others: mJ(cm$^2$)) | | | resolution (L&S, $\mu$m) | | |
|---|---|---|---|---|---|---|---|
| | | I-line | KrF excimer | EB | I-line | KrF excimer | EB |
| polysiloxane (Mw = 1.2 × 10$^5$) | | | | | | | |

Example 8
Preparation of Dissolution Inhibitor SIA-9

A solution of 5.1 g (0.03 mole) of l-chloroadamantate in 50 ml of THF was dropwise added to a mixed solution of 10.8 g (0.03 mole) of citric acid tri-t-butyl ester prepared as in Example 6, 2.4 g (0.03 mole) of pyridine and 300 ml of THF at a room temperature, and stirred for 2 hours. Thereafter, the mixture was filtered to remove the solvent, and washed with water to obtain the desired dissolution inhibitor SIA-9.

Formation of Resist Patterns

The procedure of Example 5 was repeated using the dissolution inhibitor SIA-9 prepared in the above step. The resist solution was prepared, followed by pattern formation.

The resulting resist patterns were then evaluated with regard to the sensitivity and the resolution. The results are summarized in the following Table 9.

TABLE 9

| base resin | amount of SIA added | sensitivity (EB: $\mu C/cm^2$, others: mJ(cm$^2$)) | | | resolution (L&S, $\mu$m) | | |
|---|---|---|---|---|---|---|---|
| | | I-line | KrF excimer | EB | I-line | KrF excimer | EB |
| m/p-cresol-novolak (Mw = 3.0 × 10$^3$) | 5% | 40 | 60 | 6 | 0.4 | 0.3 | 0.2 |
| phenol-novolak (Mw = 4.2 × 10$^3$) | 5% | 15 | 35 | 6 | 0.4 | 0.3 | 0.2 |
| polyhydroxystyrene (Mw = 5.0 × 10$^3$) | 10% | 10 | 20 | 5 | 0.4 | 0.3 | 0.2 |
| acetylated polysilphenylene siloxane (Mw = 2.0 × 10$^5$) | 5% | 30 | 20 | 4 | 0.4 | 0.3 | 0.15 |
| acetylated polysiloxane (Mw = 1.2 × 10$^5$) | 5% | 20 | 30 | 4 | 0.4 | 0.3 | 0.15 |

Example 9
Preparation of Dissolution Inhibitor SIA-10

2.7 g (0.01 mole) of thiodisuccinate and 8.3 g (0.04 mole) of phosphorus pentachloride was stirred along with 100 ml of chlorobenzene for 45 minutes under the flow of nitrogen gas, and the mixture was gradually heated to 100° C., and stirred for 6 hours. Thereafter, the solution was heated to 110° C., the generated phosphonylchloride (POCl$_3$) was removed, and chlorobenzene was distilled off under reduced pressure. The thus produced thiodisuccinic chloride was dissolved in THF, and dropwise added to a solution of 3.2 g (0.04 mole) of lithium t-butoxide in 300 ml of THF under the flow of nitrogen gas. Thereafter, the solvent was removed, extracted with ether and washed with water to obtain the desired dissolution inhibitor SIA-10.

Formation of Resist Patterns

The procedure of Example 5 was repeated using the dissolution inhibitor SIA-10 prepared in the above step. The resist solution was prepared, followed by pattern formation.

The resulting resist patterns were then evaluated with regard to the sensitivity and the resolution. The results are summarized in the following Table 10.

TABLE 10

| base resin | amount of SIA added | sensitivity (EB: $\mu C/cm^2$, others: mJ(cm$^2$)) | | | resolution (L&S, $\mu$m) | | |
|---|---|---|---|---|---|---|---|
| | | I-line | KrF excimer | EB | I-line | KrF excimer | EB |
| m/p-cresol-novolak (Mw = 3.0 × 10$^3$) | 5% | 50 | 30 | 8 | 0.4 | 0.3 | 0.2 |
| phenol-novolak (Mw = 4.2 × 10$^3$) | 5% | 30 | 20 | 6 | 0.4 | 0.3 | 0.1 |
| polyhydroxystyrene (Mw = 5.0 × 10$^3$) | 5% | 30 | 30 | 4 | 0.4 | 0.3 | 0.1 |
| acetylated polysilphenylene siloxane (Mw = 2.0 × 10$^5$) | 5% | 30 | 20 | 4 | 0.4 | 0.3 | 0.1 |
| acetylated polysiloxane (Mw = 1.2 × 10$^5$) | 5% | 20 | 30 | 4 | 0.4 | 0.3 | 0.15 |

Example 10
Preparation of Dissolution Inhibitor SIA-11

2.2 g (0.01 mole) of cyclohexane-1,3,5-tricarboxylic acid and 6.2 g (0.03 mole) of phosphorus pentachloride was stirred along with 100 ml of chlorobenzene for 45 minutes under the flow of nitrogen gas, and the mixture was heated to 100° C. and stirred for 6 hours. Thereafter, the solution was heated to 110° C., the generated phosphonyl chloride (POCl$_3$) was removed, and chlorobenzene was distilled off under reduced pressure. The thus prepared cyclohexane-1, 3,5-tricarboxyl chloride was dissolved in THF, and 50 ml of the THF solution was dropwise added to a mixed solution of 10.8 g (0.03 mole) of citric acid tri-t-butyl ester prepared as in Example 6, 2.4 g (0.03 mole) of pyridine and 300 ml of THF at a room temperature, and stirred for 2 hours. Thereafter, the mixture was filtered to remove the solvent, and washed with water to obtain the desired dissolution inhibitor SIA-11.

Formation of Resist Patterns

The procedure of Example 5 was repeated using the dissolution inhibitor SIA-11 prepared in the above step. The resist solution was prepared, followed by pattern formation.

The resulting resist patterns were then evaluated with regard to the sensitivity and the resolution. The results are summarized in the following Table 11.

TABLE 11

| base resin | amount of SIA added | sensitivity (EB: $\mu C/cm^2$, others: mJ(cm$^2$)) | | | resolution (L&S, $\mu$m) | | |
|---|---|---|---|---|---|---|---|
| | | I-line | KrF excimer | EB | I-line | KrF excimer | EB |
| m/p-cresol-novolak (Mw = 3.0 × 10$^3$) | 5% | 20 | 20 | 2 | 0.4 | 0.3 | 0.2 |
| phenol-novolak | 5% | 15 | 25 | 2 | 0.4 | 0.3 | 0.2 |

TABLE 11-continued

| base resin | amount of SIA added | sensitivity (EB: $\mu C/cm^2$, others: mJ(cm$^2$)) | | | resolution (L&S, $\mu$m) | | |
|---|---|---|---|---|---|---|---|
| | | I-line | KrF ex-cimer | EB | I-line | KrF ex-cimer | EB |
| (Mw = 4.2 × 10$^3$) polyhydroxystyrene (Mw = 5.0 × 10$^3$) | 10% | 15 | 15 | 1.7 | 0.4 | 0.3 | 0.15 |
| acetylated polysilphenylene siloxane (Mw = 2.0 × 10$^5$) | 5% | 30 | 30 | 2 | 0.4 | 0.3 | 0.1 |
| acetylated polysiloxane (Mw = 1.2 × 10$^5$) | 5% | 20 | 25 | 3 | 0.4 | 0.3 | 0.2 |

Example 11
Preparation of Dissolution Inhibitor SIA-12

A solution of 3.6 g (0.03 mole) of isonicotinic chloride in 50 ml of THF was dropwise added to a mixed solution of 10.8 g (0.03 mole) of citric acid tri-t-butyl ester, 2.4 g (0.03 mole) of pyridine and 300 ml of THF at a room temperature, and stirred for 2 hours. Thereafter, the mixture was filte red to remove the solvent and washed with water to obtain the desired dissolution inhibitor SIA-12.

Formation of Resist Patterns

The procedure of Example 5 was repeated using the dissolution inhibitor SIA-12 prepared in the above step. The resist solution was prepared, followed by pattern formation.

The resulting resist patterns were then evaluated with regard to the sensitivity and the resolution. The results are summarized in the following Table 12.

TABLE 12

| base resin | amount of SIA added | sensitivity (EB: $\mu C/cm^2$, others: mJ(cm$^2$)) | | | resolution (L&S, $\mu$m) | | |
|---|---|---|---|---|---|---|---|
| | | I-line | KrF ex-cimer | EB | I-line | KrF ex-cimer | EB |
| m/p-cresol-novolak (Mw = 3.0 × 10$^3$) | 5% | 20 | 20 | 2 | 0.4 | 0.3 | 0.2 |
| phenol-novolak (Mw = 4.2 × 10$^3$) | 5% | 15 | 25 | 2 | 0.4 | 0.3 | 0.2 |
| polyhydroxystyrene (Mw = 5.0 × 10$^3$) | 10% | 15 | 15 | 1.7 | 0.4 | 0.3 | 0.15 |
| acetylated polysilphenylene siloxane (Mw = 2.0 × 10$^5$) | 5% | 30 | 30 | 2 | 0.4 | 0.3 | 0.1 |
| acetylated polysiloxane (Mw = 1.2 × 10$^5$) | 5% | 20 | 25 | 3 | 0.4 | 0.3 | 0.2 |

Example 12
Preparation of Dissolution Inhibitor SIA-13

A solution of 5.7 g (0.03 mole) of 1,2-phenylene phosphorochloridate in 50 ml of THF was dropwise added to a mixed solution of 10.8 g (0.03 mole) of citric acid tri-t-butyl ester prepared in Example 6, 2.4 g (0.03 mole) of pyridine and 300 ml of THF at a room temperature, and stirred for 2 hours. Thereafter, the mixture was filtered to remove the solvent, and washed with water to obtain the desired dissolution inhibitor SIA-13.

Formation of Resist Patterns

The procedure of Example 5 was repeated using the dissolution inhibitor SIA-13 prepared in the above step. The resist solution was prepared, followed by pattern formation.

The resulting resist patterns were then evaluated with regard to the sensitivity and the resolution. The results are summarized in the following Table 13.

TABLE 13

| base resin | amount of SIA added | sensitivity (EB: $\mu C/cm^2$, others: mJ(cm$^2$)) | | | resolution (L&S, $\mu$m) | | |
|---|---|---|---|---|---|---|---|
| | | I-line | KrF ex-cimer | EB | I-line | KrF ex-cimer | EB |
| m/p-cresol-novolak (Mw = 3.0 × 10$^3$) | 5% | 35 | 40 | 2 | 0.4 | 0.3 | 0.15 |
| phenol-novolak (Mw = 4.2 × 10$^3$) | 5% | 25 | 30 | 2.3 | 0.4 | 0.3 | 0.15 |
| polyhydroxystyrene (Mw = 5.0 × 10$^3$) | 5% | 25 | 15 | 2 | 0.4 | 0.3 | 0.1 |
| acetylated polysilphenylene siloxane (Mw = 2.0 × 10$^5$) | 5% | 15 | 30 | 3 | 0.4 | 0.3 | 0.2 |
| acetylated polysiloxane (Mw = 1.2 × 10$^5$) | 5% | 20 | 30 | 1.5 | 0.4 | 0.3 | 0.2 |

Example 13
Preparation of Dissolution Inhibitor SIA-14

2.2 g (0.01 mole) of cyclohexane-1,3,5-tricarboxylic acid and 6.2 g (0.03 mole) of phosphorus pentachloride were stirred along with 100 ml of chlorobenzene under flow of nitrogen gas, and gradually heated to 100° C. and stirred for 6 hours. Thereafter, the solution was heated to 110° C., the generated phosphonyl chloride (POCl$_3$) was removed, and chlorobenzene was distilled off under reduced pressure. The thus prepared cyclohexane-1,3,5-tricarboxy chloride was dissolved in THF, and 50 ml of the THF solution was dropwise added to a mixed solution of 3.4 g (0.03 mole) of sodium trimethylsilanolate, 2.4 g (0.03 mole) of pyridine and 300 ml of THF at room temperature, and stirred for 2 hours. Thereafter, the mixture was filtered to remove the solvent, and washed with water to obtain the desired dissolution inhibitor SIA-14.

Formation of Resist Patterns

The procedure of Example 5 was repeated using the dissolution inhibitor SIA-14 prepared in the above step. The resist solution was prepared, followed by pattern formation.

The resulting resist patterns were then evaluated with regard to the sensitivity and the resolution. The results are summarized in the following Table 14.

TABLE 14

| base resin | amount of SIA added | sensitivity (EB: $\mu C/cm^2$, others: mJ(cm$^2$)) | | | resolution (L&S, $\mu$m) | | |
|---|---|---|---|---|---|---|---|
| | | I-line | KrF ex-cimer | EB | I-line | KrF ex-cimer | EB |
| m/p-cresol-novolak (Mw = 3.0 × 10$^3$) | 5% | 20 | 50 | 1.7 | 0.4 | 0.3 | 0.1 |
| phenol-novolak (Mw = 4.2 × 10$^3$) | 5% | 20 | 50 | 2 | 0.4 | 0.3 | 0.15 |

TABLE 14-continued

| base resin | amount of SIA added | sensitivity (EB: $\mu C/cm^2$, others: mJ(cm$^2$)) | | | resolution (L&S, $\mu$m) | | |
|---|---|---|---|---|---|---|---|
| | | I-line | KrF excimer | EB | I-line | KrF excimer | EB |
| polyhydroxystyrene (Mw = 5.0 × 10$^3$) | 10% | 30 | 35 | 2.3 | 0.4 | 0.3 | 0.1 |
| acetylated polysilphenylene siloxane (Mw = 2.0 × 10$^5$) | 5% | 45 | 35 | 2 | 0.4 | 0.3 | 0.1 |
| acetylated polysiloxane (Mw = 1.2 × 10$^5$) | 5% | 30 | 35 | 2 | 0.4 | 0.3 | 0.2 |

Further, the above procedure was repeated with the proviso that 0.05 g of 2,6-dinitrobenzyl tosylate was used in place of 0.05 g of triphenylsulfonium trifulate as the photoacid generator. The sensitivity and dissolution of the resulting resist patterns are summarized in the following Table 15.

TABLE 15

| base resin | amount of SIA added | sensitivity (EB: $\mu C/cm^2$, others: mJ(cm$^2$)) | | | resolution (L&S, $\mu$m) | | |
|---|---|---|---|---|---|---|---|
| | | I-line | KrF excimer | EB | I-line | KrF excimer | EB |
| m/p-cresol-novolak (Mw = 3.0 × 10$^3$) | 5% | 25 | 20 | 4 | 0.4 | 0.3 | 0.2 |
| phenol-novolak (Mw = 4.2 × 10$^3$) | 5% | 20 | 15 | 4 | 0.4 | 0.3 | 0.15 |
| polyhydroxystyrene (Mw = 5.0 × 10$^3$) | 10% | 30 | 20 | 6 | 0.4 | 0.3 | 0.2 |
| acetylated polysilphenylene siloxane (Mw = 2.0 × 10$^5$) | 5% | 30 | 30 | 7.2 | 0.4 | 0.3 | 0.2 |
| acetylated polysiloxane (Mw = 1.2 × 10$^5$) | 5% | 25 | 20 | 5 | 0.4 | 0.3 | 0.2 |

Example 14
Preparation of Dissolution Inhibitor SIA-15

3.58 g (0.01 mole) of benzophenone tetracarboxylic acid, 5.08 g (0.04 mole) of oxalic chloride and a trace amount of pyridine were heated in 150 ml of benzene at 55° C. for 24 hours with stirring. Thereafter, benzene was removed on an evaporator to obtain benzophenone tetracarboxyl chloride. 4.32 g (0.01 mole) of the thus prepared benzophenone tetracarboxyl chloride was dissolved in 50 ml of methylene chloride, and dropwise added to a mixture of 8.08 g (0.08 mole) of triethylamine, cooled to 0° C., and 43.4 g (0.4 mole) of 2-chloromethyl-2-propanol for 30 minutes, and then stirred for 6 hours. Thereafter, the solvent was removed, extracted with ether, and washed with water to obtain the desired dissolution inhibitor SIA-15.

Formation of Resist Patterns

The dissolution inhibitor SIA-15 prepared in the above step was dissolved, along with 1 g of the base resin described in the following Table 16 and 0.05 g of the photoacid generator, triphenylsulfonium trifulate, in 9 g of ethyl lactate, and then filtered on a 0.2 $\mu$m membrane filter. The resulting resist solution was coated at a thickness of 0.7 $\mu$m on a silicon wafer, and dried. The resulting sample of the resist coating was patternwise exposed to each of i-line, KrF excimer laser and electron beam (EB) in accordance with the conventional manner. Immediately after exposure, the sample was postbaked at 90° C. for 2 minutes on a hot plate, and then dip-developed for one minute in an aqueous solution of 2.38% tetramethylammonium hydroxide (TMAH). The positive resist patterns were thus obtained.

The resulting resist patterns were then evaluated with regard to the sensitivity and the resolution. The results are summarized in the following Table 16.

TABLE 16

| base resin | amount of SIA added | sensitivity (EB: $\mu C/cm^2$, others: mJ/cm$^2$) | | | resolution (L&S, $\mu$m) | | |
|---|---|---|---|---|---|---|---|
| | | I-line | KrF excimer | EB | I-line | KrF excimer | EB |
| m/p-cresol-novolak (Mw = 3.0 × 10$^3$) | 5% | 20 | 20 | 2 | 0.4 | 0.3 | 0.2 |
| phenol-novolak (Mw = 4.2 × 10$^3$) | 5% | 20 | 20 | 2 | 0.4 | 0.3 | 0.15 |
| polyhydroxystyrene (Mw = 5.0 × 10$^3$) | 5% | 20 | 20 | 5 | 0.4 | 0.3 | 0.15 |
| acetylated polysilphenylene siloxane (Mw = 2.0 × 10$^5$) | 5% | 30 | 30 | 3 | 0.4 | 0.3 | 0.1 |
| acetylated polysiloxane (Mw = 1.2 × 10$^5$) | 5% | 20 | 25 | 3 | 0.4 | 0.3 | 0.2 |

The above results indicate that all the resist samples can exhibit high sensitivity and high resolution.

Example 15
Preparation of Dissolution Inhibitor SIA-16

4.32 g (0.01 mole) of benzophenone tetracarboxyl chloride prepared in Example 14 was dissolved in 50 ml of methylene chloride, and dropwise added to a mixture of 8.08 g (0.08 mole) of triethylamine, cooled to 0° C., and 71 g (0.4 mole) of 2-trichloromethyl-2-propanol for 30 minutes, and then stirred for 6 hours. Thereafter, the solvent was removed, extracted with ether, and washed with water to obtain the desired dissolution inhibitor SIA-16.

Formation of Resist Patterns

The procedure of Example 14 was repeated using the dissolution inhibitor SIA-16 prepared in the above step. The resist solution was prepared, followed by pattern formation.

The resulting resist patterns were then evaluated with regard to the sensitivity and the resolution. The results are summarized in the following Table 17.

TABLE 17

| base resin | amount of SIA added | sensitivity (EB: $\mu C/cm^2$, others: mJ/cm$^2$) | | | resolution (L&S, $\mu$m) | | |
|---|---|---|---|---|---|---|---|
| | | I-line | KrF excimer | EB | I-line | KrF excimer | EB |
| m/p-cresol-novolak (Mw = 3.0 × 10$^3$) | 5% | 10 | 25 | 2 | 0.4 | 0.3 | 0.2 |
| phenol-novolak (Mw = 4.2 × 10$^3$) | 5% | 10 | 35 | 5 | 0.4 | 0.3 | 0.15 |
| polyhydroxystyrene (Mw = 5.0 × 10$^3$) | 5% | 20 | 35 | 4 | 0.4 | 0.3 | 0.25 |

TABLE 17-continued

| base resin | amount of SIA added | sensitivity (EB: $\mu C/cm^2$, others: $mJ/cm^2$) | | | resolution (L&S, $\mu m$) | | |
|---|---|---|---|---|---|---|---|
| | | I-line | KrF excimer | EB | I-line | KrF excimer | EB |
| acetylated polysilphenylene siloxane (Mw = 2.0 × 10$^5$) | 5% | 25 | 25 | 3.3 | 0.4 | 0.3 | 0.25 |
| acetylated polysiloxane (Mw = 1.2 × 10$^5$) | 5% | 15 | 35 | 3 | 0.4 | 0.3 | 0.2 |

The above results indicate that all the resist samples can exhibit high sensitivity and high resolution.

Example 16
Preparation of Dissolution Inhibitor SIA-17

2.2 g (0.01 mole) of cyclohexane-1,3,5-tricarboxylic acid, 5.08 g (0.04 mole) of oxalic chloride and a trace amount of pyridine were heated in 150 ml of benzene at 55° C. for 24 hours with stirring. Thereafter, benzene was removed on an evaporator to obtain cyclohexane-1,3,5-tricarboxyl chloride. 3.12 g (0.01 mole) of the thus prepared cyclohexane-1,3,5-tricarboxyl chloride was dissolved in 50 ml of methylene chloride, and dropwise added to a mixture of 8.08 g (0.08 mole) of triethylamine, cooled to 0° C., and 43.4 g (0.4 mole) of 2-chloromethyl-2-propanol for 30 minutes, and then stirred for 6 hours. Thereafter, the solvent was removed, extracted with ether, and washed with water to obtain the desired dissolution inhibitor SIA-17.

Formation of Resist Patterns

The procedure of Example 14 was repeated using the dissolution inhibitor SIA-17 prepared in the above step. The resist solution was prepared, followed by pattern formation.

The resulting resist patterns were then evaluated with regard to the sensitivity and the resolution. The results are summarized in the following Table 18.

TABLE 18

| base resin | amount of SIA added | sensitivity (EB: $\mu C/cm^2$, others: $mJ/cm^2$) | | | resolution (L&S, $\mu m$) | | |
|---|---|---|---|---|---|---|---|
| | | I-line | KrF excimer | EB | I-line | KrF excimer | EB |
| m/p-cresol-novolak (Mw = 3.0 × 10$^3$) | 5% | 20 | 15 | 2 | 0.4 | 0.3 | 0.15 |
| phenol-novolak (Mw = 4.2 × 10$^3$) | 5% | 20 | 30 | 2 | 0.4 | 0.3 | 0.15 |
| polyhydroxystyrene (Mw = 5.0 × 10$^3$) | 5% | 25 | 30 | 2 | 0.4 | 0.3 | 0.15 |
| acetylated polysilphenylene siloxane (Mw = 2.0 × 10$^5$) | 5% | 30 | 30 | 3 | 0.4 | 0.3 | 0.15 |
| acetylated polysiloxane (Mw = 1.2 × 10$^5$) | 5% | 20 | 30 | 4.5 | 0.4 | 0.3 | 0.15 |

Example 17
Preparation of Dissolution Inhibitor SIA-18

4.32 g (0.01 mole) of cyclohexane-1,3,5-tricarboxyl chloride prepared in Example 16 was dissolved in 50 ml of methylene chloride, and dropwise added to a mixture of 8.08 g (0.08 mole) of triethylamine, cooled to 0° C., and 71 g (0.4 mole) of 2-trichloromethyl-2-propanol for 30 minutes, and then stirred for 6 hours. Thereafter, the solvent was removed, extracted with ether, and washed with water to obtain the desired dissolution inhibitor SIA-18.

Formation of Resist Patterns

The procedure of Example 14 was repeated using the dissolution inhibitor SIA-18 prepared in the above step. The resist solution was prepared, followed by pattern formation.

The resulting resist patterns were then evaluated with regard to the sensitivity and the resolution. The results are summarized in the following Table 19.

TABLE 19

| base resin | amount of SIA added | sensitivity (EB: $\mu C/cm^2$, others: $mJ/cm^2$) | | | resolution (L&S, $\mu m$) | | |
|---|---|---|---|---|---|---|---|
| | | I-line | KrF excimer | EB | I-line | KrF excimer | EB |
| m/p-cresol-novolak (Mw = 3.0 × 10$^3$) | 5% | 40 | 40 | 6 | 0.4 | 0.3 | 0.2 |
| phenol-novolak (Mw = 4.2 × 10$^3$) | 5% | 35 | 25 | 6 | 0.4 | 0.3 | 0.2 |
| polyhydroxystyrene (Mw = 5.0 × 10$^3$) | 10% | 20 | 20 | 5 | 0.4 | 0.3 | 0.2 |
| acetylated polysilphenylene siloxane (Mw = 2.0 × 10$^5$) | 5% | 30 | 20 | 4 | 0.4 | 0.3 | 0.15 |
| acetylated polysiloxane (Mw = 1.2 × 10$^5$) | 5% | 20 | 30 | 4 | 0.4 | 0.3 | 0.15 |

What is claimed is:

1. A chemical amplification resist composition for forming resist patterns which comprises a combination of an alkali-soluble base resin, a photoacid generator and a dissolution inhibitor, in which said dissolution inhibitor is a compound of the following formula (I):

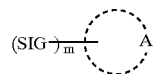

(I)

wherein
A represents atoms necessary to complete a cyclic structure having no conjugated double bond which constitutes a matrix portion of the molecule of said dissolution inhibitor,
SIG may be the same or different and each represents a dissolution inhibiting group capable of being released from said cyclic or acyclic structure A, to which said dissolution inhibiting group is directly or indirectly bonded, upon the action of an acid which is released from said photoacid generator, and
m represents the number of said dissolution inhibiting groups SIG bonded to said structure A and is an integer of 1 or more, and
said structure A of said compound of the dissolution inhibitor contains at least two lone pair-containing portions which can provide a hydrogen bond sufficient to shift and gather an alkali-soluble moiety of said base resin towards a side of said molecule of the dissolution inhibitor compound, and said lone pair-containing portion is a member selected from the group consisting of:
(1) a double bonded oxygen atom-containing group of the following formula:

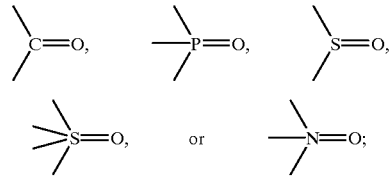

(2) an alkoxy or alkoxycarbonyl group of the following formula:

—OCH$_3$, —OCH$_2$CH$_3$, —OOCCH$_3$, —OOCCH$_2$CH$_3$, —OCCH$_3$, —OCCH$_2$CH$_3$, —COOCH$_3$ or —COOCH$_2$CH$_3$; and (3) a halogen atom including chlorine, fluorine, iodine and bromine, with the proviso that when the lone pair-containing portions are alkoxy or alkoxycarbonyl groups (2) at least three alkoxy or alkoxycarbonyl groups (2) are contained in the compound, and when the lone pair-containing portions are halogen atoms (3) at least three halogen atoms (3) are contained in the compound.

2. The chemical amplification resist composition as in any one of claim 1, in which said dissolution inhibiting group SIG of said dissolution inhibitor compound is a member selected from the group consisting of:

SIG-1
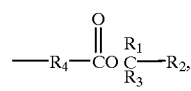

SIG-2
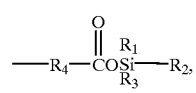

SIG-3
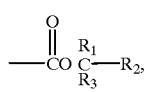

SIG-4
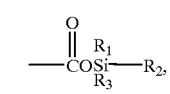

SIG-5
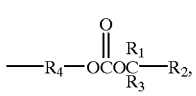

SIG-6
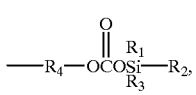

SIG-7
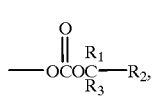

SIG-8
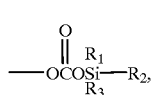

-continued

SIG-9
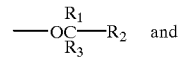 and

SIG-10
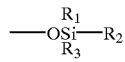

wherein
R$_1$, R$_2$ and R$_3$ may be the same or different and each represents a hydrogen or a methyl, ethyl, phenyl, cyclohexyl or cyclopentyl which may be substituted or unsubstituted, and
R$_4$ represents a substituted or unsubstituted, methylene or ethylene group.

3. The chemical amplification resist composition as in any one of claim 1, in which said base resin is a member selected from the group consisting of phenol-novolak resin, cresol-novolak resin, phenol-cresol-novolak resin, copolymer of polyhydroxystyrene, polycarboxystyrene and/or hydroxystyrene with a monomer containing a carbon—carbon double bond, copolymer of carboxystyrene with a monomer containing a carbon—carbon double bond, copolymer of hydroxystyrene with carboxystyrene, silphenylenesiloxane polymer containing an acetylated benzene ring, siloxane polymer containing an acetylated benzene ring, silphenylenesiolxane polymer containing a silanol group, siloxane polymer containing a silanol group, silphenylenesiloxane polymer containing a carboxyl or acidic hydroxyl group, and siloxane polymer containing a carboxyl or acidic hydroxyl group.

4. A chemical amplification resist composition for forming resist patterns which comprises a combination of an alkali-soluble base resin, a photoacid generator and a dissolution inhibitor, in which said dissolution inhibitor is a compound of the following formula (II):

(II)
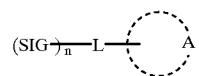

wherein
A represents atoms necessary to complete a cyclic or acyclic structure constituting a matrix portion of the molecule of said dissolution inhibitor, said structure A containing at least one atom selected from the group consisting of an oxygen atom, a sulfur atom, a halogen atom, a nitrogen atom and a phosphorus atom, SIG may be the same or different and each represents a dissolution inhibiting group capable of being released from said cyclic or acyclic structure A, to which said dissolution inhibiting group is indirectly bonded through a linkage group L, upon the action of an acid which is released from said photoacid generator, and is concentratedly distributed in the molecule of said dissolution inhibitor, L is a linkage group connecting the SIG group to said structure A, and may be independently included for each SIG group or may be commonly included for two or more SIG groups with the proviso that the number of atoms contained between the adjacent SIG groups is not more than 4, and n represents the number of said SIG groups bonded to said structure A and is an integer of 3 or more.

5. The chemical amplification resist composition as in claim 4, in which the structure A of said dissolution inhibitor compound contains at least one double-bonded oxygen atom-containing group of the following formula:

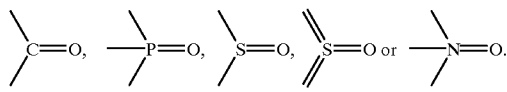

6. The chemical amplification resist composition, as in any one of claim 4, in which the structure A of said dissolution inhibitor compound is an aromatic group, a saturated cyclic group or a chain group.

7. The chemical amplification resist composition as in claim 6, in which the saturated cyclic group constituting said structure A of the dissolution inhibitor compound is a member selected from the group consisting of cyclooctyl ring, cycloheptyl ring, cyclohexyl ring, cyclopentyl ring, cyclobutyl ring, adamantyl ring, tetrahydrofuranyl ring, tetrahydrothiophenyl ring, dioxanyl ring, cyclooctanonyl ring, cycloheptanonyl ring, cyclohexanonyl ring, cyclopentanonyl ring, cyclobutanonyl ring, butylocactone ring, piperidinyl ring and piperadinyl ring.

8. The chemical amplification resist composition as in any one of claim 4, in which said dissolution inhibiting group SIG of said dissolution inhibitor compound is a member selected from the group consisting of:

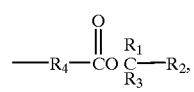 SIG-1

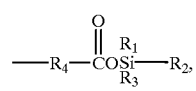 SIG-2

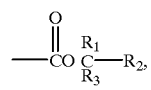 SIG-3

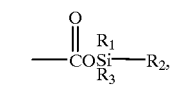 SIG-4

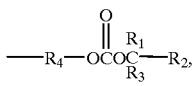 SIG-5

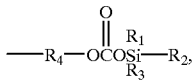 SIG-6

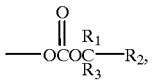 SIG-7

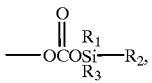 SIG-8

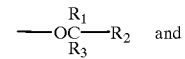 SIG-9 and

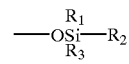 SIG-10 wherein $R_1$, $R_2$ and $R_3$ may be the same or different and each represents a hydrogen or a methyl, ethyl, phenyl, cyclohexyl or cyclopentyl which may be substituted or unsubstituted, and $R_4$ represents a substituted or unsubstituted, methylene or ethylene group.

9. The chemical amplification resist composition as in any one of claim 4, in which said base resin is a member selected frog the group consisting of phenol-novolak resin, cresol-novolak resin, phenol-cresol-novolak resin, copolymer of polyhydroxystyrene, polycarboxystyrene and/or hydroxystyrene with a monomer containing a carbon—carbon double bond, copolymer of carboxystyrene with a monomer containing a carbon—carbon double bond, copolymer of hydroxystyrene with carboxystyrene, silphenylenesiloxane polymer containing an acetylated benzene ring, siloxane polymer containing an acetylated benzene ring, silphenylenesiolxane polymer containing a silanol group, siloxane polymer containing a silanol group, silphenylenesiloxane polymer containing a carboxyl or acidic hydroxyl group, and siloxane polymer containing a carboxyl or acidic hydroxyl group.

10. A chemical amplification resist composition for forming resist patterns which comprises a combination of an alkali-soluble base resin, a photoacid generator and a dissolution inhibitor, in which said dissolution inhibitor is a compound of the following formula (III):

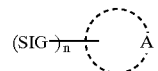 (III)

wherein

A represents atoms necessary to complete a cyclic or acyclic structure constituting a matrix portion of the molecule of said dissolution inhibitor, SIG may be the same or different and each represents a dissolution inhibiting group capable of being released from said cyclic or acyclic structure A to which said dissolution inhibiting group is directly or indirectly bonded, upon the action of an acid which is released from said photoacid generator, said SIG group being a member selected from the group consisting of:

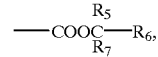 SIG-11

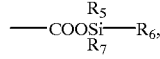 SIG-12

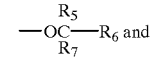 SIG-13

-continued

SIG-14
$$—\underset{R_7}{\overset{R_5}{OSi}}—R_6$$

wherein
R$_5$, R$_6$ and R$_7$ may be the same or different and each represents hydrogen or any substituent group with the proviso that at least one of said substituent groups is a halogenated alkyl group of 3 or less carbon atoms and a ratio of hydrogen atoms to halogen atoms in one halogenated alkyl group is in the range of 15:1 to 1:1, and n represents the number of said dissolution inhibiting groups SIG bonded to said structure A and is an integer of 3 or more, and said dissolution inhibitor compound has a molecular weight of 300 to 1500.

11. The chemical amplification resist composition as in claim 10, in which the structure A of said dissolution inhibitor compound is benzophenone, adamantane or cyclohexane.

12. The chemical amplification resist as in claim 10 or 11, in which said base resin is a member selected from the group consisting of phenol-novolak resin, cresol-novolak resin, phenol-cresol-novolak resin, copolymer of polyhydroxystyrene, polycarboxystyrene and/or hydroxystyrene with a monomer containing a carbon—carbon double bond, copolymer of carboxystyrene with a monomer containing a carbon—carbon double bond, copolymer of hydroxystyrene with carboxystyrene, silphenylenesiloxane polymer containing an acetylated benzene ring, siloxane polymer containing an acetylated benzene ring, silphenylenesiolxane polymer containing a silanol group, siloxane polymer containing a silanol group, silphenylenesiloxane polymer containing a carboxyl or acidic hydroxyl group, and siloxane polymer containing a carboxyl or acidic hydroxyl group.

13. The chemical amplification resist composition as in any one of claims 10 or 11, in which the photoacid generator is a member selected from the group consisting of a sulfonium salt compound, an iodonium salt compound, a benzyltosylate compound and an organic halogen-containing compound.

14. A process for the preparation of a chemical amplification resist composition comprising a combination of an alkali-soluble base resin, a photoacid generator and a dissolution inhibitor, which process comprises the steps of:
preparing a dissolution inhibitor compound of the following formula (I):

$$(SIG)_m—\overset{\overset{\cdot\phantom{a}\cdot}{\cdot\phantom{a}\cdot}}{A} \quad (I)$$

wherein
A represents atoms necessary to complete a cyclic structure having no conjugated double bond which constitutes a matrix portion of the molecule of said dissolution inhibitor,
SIG may be the same or different and each represents a dissolution inhibiting group capable of being released from said cyclic or acyclic structure A, to which said dissolution inhibiting group is directly or indirectly bonded, upon the action of an acid which is released from said photoacid generator, and m represents the number of said dissolution inhibiting groups SIG bonded to said structure A and is an integer of 1 or more, and said structure A contains at least two lone pair-containing portions which can provide a hydrogen bond sufficient to shift and gather an alkali-soluble moiety of said base resin towards a side of said molecule of the dissolution inhibitor compound, and said lone pair-containing portion is a member selected from the group consisting of:

(1) a double bonded oxygen atom-containing group of the following formula:

$$\overset{\diagdown}{\underset{\diagup}{C}}=O, \quad —\overset{\diagdown}{\underset{\diagup}{P}}=O, \quad \overset{\diagdown}{\underset{\diagup}{S}}=O,$$

$$\overset{\diagdown}{\underset{\diagup}{\overset{\diagdown}{S}}}=O, \quad or \quad —\overset{\diagdown}{\underset{\diagup}{N}}=O;$$

(2) an alkoxy or alkoxycarbonyl group of the following formula:

—OCH$_3$, —OCH$_2$CH$_3$, —OOCCH$_3$, —OOCCH$_2$CH$_3$, —OCCH$_3$, —OCCH$_2$CH$_3$, —COOCH$_3$ or —COOCH$_2$CH$_3$; and (3) a halogen atom including chlorine, fluorine, iodine and bromine, with the proviso that when the lone pair-containing portions are alkoxy or alkoxycarbonyl groups (2) at least three alkoxy or alkoxycarbonyl groups (2) are contained in the compound, and when the lone pair-containing portions are halogen atoms (3) at least three halogen atoms (3) are contained in the compound, and dissolving the resulting dissolution inhibitor compound along with the base resin and the photoacid generator in a resist solvent to make a resist solution.

15. A process for the preparation of a chemical amplification resist composition for forming resist patterns comprising a combination of an alkali-soluble base resin, a photoacid generator and a dissolution inhibitor, which process comprises the steps of:
preparing a dissolution inhibitor compound of the following formula (II):

$$(SIG)_n—L—\overset{\overset{\cdot\phantom{a}\cdot}{\cdot\phantom{a}\cdot}}{A} \quad (II)$$

wherein
A represents atoms necessary to complete a cyclic or acyclic structure constituting a matrix portion of the molecule of said dissolution inhibitor, said structure A containing at least one atom selected from the group consisting of an oxygen atom, a sulfur atom, a halogen atom, a nitrogen atom and a phosphorus atom,
SIG may be the same or different and each represents a dissolution inhibiting group capable of being released from said cyclic or acyclic structure A, to which said dissolution inhibiting group is indirectly bonded through a linkage group L, upon the action of an acid which is released from said photoacid generator, and is concentratedly distributed in the molecule of said dissolution inhibitor, L is a linkage group connecting the SIG group to said structure A, and may be independently included for each SIG group or may be commonly included for two or more SIG groups with the proviso that the number of atoms contained between the adjacent SIG groups is not more than 4, and n represents the number of said SIG groups bonded to said structure A and is an integer of 3 or more; and dissolving the resulting dissolution inhibitor compound along with the base resin and the photoacid generator in a resist solvent to make a resist solution.

16. A process for the preparation of a chemical amplification resist composition comprising a combination of an alkali-soluble base resin, a photoacid generator and a dissolution inhibitor, which process comprises the steps of:

preparing a dissolution inhibitor compound of the following formula (III):

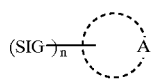

(III)

wherein

A represents atoms necessary to complete a cyclic or acyclic structure constituting having no conjugated double bond which constitutes a matrix portion of the molecule of said dissolution inhibitor, SIG may be the same or different and each represents a dissolution inhibiting group capable of being released from said cyclic or acyclic structure A, to which said dissolution inhibiting group is directly or indirectly bonded, upon the action of an acid which is released from said photoacid generator, said SIG group being a member selected from the group consisting of:

SIG-11

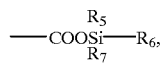

SIG-12

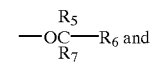

SIG-13

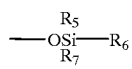

SIG-14 wherein $R_5$, $R_6$ and $R_7$ may be the same or different and each represents hydrogen or any substituent group with the proviso that at least one of said substituent groups is a halogenated alkyl group of 3 or less carbon atoms and a ratio of hydrogen atoms to halogen atoms in one halogenated alkyl group is in the range of 15:1 to 1:1, and n represents the number of said dissolution inhibiting groups SIG bonded to said structure A and is an integer of 3 or more, and said dissolution inhibitor compound has a molecular weight of 300 to 1500; and dissolving the resulting dissolution compound along with the base resin and the photoacid generator in a resist solvent to make a resist solution.

* * * * *